United States Patent
Narkonski et al.

(10) Patent No.: US 11,802,911 B2
(45) Date of Patent: Oct. 31, 2023

(54) SCAN TESTING IN A PROCESSOR

(71) Applicant: Graphcore Limited, Bristol (GB)

(72) Inventors: Natalie Narkonski, Bristol (GB); Philip Horsfield, Bristol (GB)

(73) Assignee: GRAPHCORE LIMITED, Bristol (GB)

( * ) Notice: Subject to any disclaimer, the term of this patent is extended or adjusted under 35 U.S.C. 154(b) by 0 days.

(21) Appl. No.: 17/814,393

(22) Filed: Jul. 22, 2022

(65) Prior Publication Data
US 2023/0031250 A1  Feb. 2, 2023

(30) Foreign Application Priority Data
Jul. 27, 2021  (GB) .................................. 2110772

(51) Int. Cl.
G01R 31/3185   (2006.01)
G06F 11/22     (2006.01)
G06F 11/267    (2006.01)

(52) U.S. Cl.
CPC ......... *G01R 31/318536* (2013.01); *G01R 31/318555* (2013.01); *G01R 31/318572* (2013.01); *G06F 11/2236* (2013.01); *G06F 11/267* (2013.01)

(58) Field of Classification Search
CPC .... G01R 31/318536; G01R 31/318555; G01R 31/318572; G06F 11/2236; G06F 11/267
USPC ..................... 714/726, 727, 729
See application file for complete search history.

(56) References Cited

U.S. PATENT DOCUMENTS

| | | | |
|---|---|---|---|
| 2009/0080759 A1* | 3/2009 | Bhaskar | G06T 7/001 |
| | | | 382/141 |
| 2012/0089812 A1* | 4/2012 | Smith | G06F 9/4843 |
| | | | 712/21 |
| 2018/0067164 A1* | 3/2018 | Maheshwari | G01R 31/31725 |
| 2018/0225403 A1* | 8/2018 | Nicol | H03K 19/0008 |
| 2023/0031250 A1* | 2/2023 | Narkonski | G06F 11/2236 |
| 2023/0036665 A1* | 2/2023 | Felix | G06F 11/267 |
| 2023/0116320 A1* | 4/2023 | Felix | H01L 24/16 |
| | | | 257/686 |

OTHER PUBLICATIONS

Burchard et al., iPUG for Multiple Graphcore IPUs: Optimizing Performance and Scalability of Parallel Breadth-First Search, Dec. 2021, IEEE, pp. 162-171. (Year: 2021).*

* cited by examiner

*Primary Examiner* — John J Tabone, Jr.
(74) *Attorney, Agent, or Firm* — HAYNES AND BOONE LLP

(57) ABSTRACT

A processor comprises an exchange, a plurality of columns, and a plurality of exchange scan chains. The exchange comprises a plurality of exchange paths, each comprising a set of exchange path portions, for transmitting data between processing units. Each of the plurality of column comprises processing units, each processing unit connected to output data to a respective exchange path, and column pipe circuitry for providing a controllable path between the exchange and the processing units. The column pipe circuitry comprises a column wrapper chain for preventing a scan test signal from passing between the exchange paths and the processing units. The exchange scan chains enable scan testing of the exchange paths. Each exchange scan chain comprises a plurality of scan chain segments, each scan chain segment comprises an exchange path portion connected to at least one of the processing units of at least one of the columns of the processor.

20 Claims, 16 Drawing Sheets

SCAN TESTING IN A PROCESSOR

CROSS-REFERENCE TO RELATED APPLICATIONS

The present application claims priority to United Kingdom Patent Application No. GB2110772.7, filed Jul. 27, 2021, the disclosure of which is hereby incorporated herein by reference in its entirety.

TECHNICAL FIELD

The present disclosure relates to scan testing in a processor.

BACKGROUND

In the context of processing data for complex or high volume applications, a work accelerator may be a subsystem to which a processing of certain data is off loaded from a host system. Such a work accelerator may have specialised hardware for performing specific types of processing.

In particular, a work accelerator specialised for machine learning applications may have an architecture which supports a high degree of parallelism. One form of parallelism can be achieved by means of a processor comprising an arrangement of multiple tiles on the same chip (i.e. same die), each tile comprising its own respective processing unit and memory (including program memory and data memory). Thus, separate portions of program code can be run in parallel on different ones of the tiles. The tiles are connected together via an on-chip interconnect which enables data to be exchanged between them. Such an accelerator may function as a subsystem for a host system to perform parallel processing of datasets provided to it.

One such specialised work accelerator is a so-called intelligence processing unit (IPU) developed by Graphcore and described for example in U.S. patent application Ser. Nos. 16/389,682 and 15/886,131. In this architecture, a plurality of processing units is arranged in respective columns on the chip. The processor has an exchange fabric for exchanging messages between sending and receiving processing units in a so-called time deterministic fashion. That is, there is a fixed transmission time for transmitting a message from a sending processing unit to a receiving processing unit, based on the physical positions of the sending and receiving processing units. The columns (and processing units within the columns) are arranged with respect to the exchange fabric such that the fixed transmission time depends on the distances of the processing circuits with respect to the exchange fabric.

Each processing unit has a data output connected to a respective exchange path of the exchange fabric. Each processing unit has a data input which is connectable to one of the exchange paths of the exchange fabric via switching circuitry which is controllable by that processing unit. At a predetermined time, the switching circuitry is controlled to selectively connect one of the exchange paths to a receiving tile.

Such a processor may be repairable. That is, it may be determined that one or more of the processing units are defective and need to be "repaired out". In principle, this can be done in a number of different ways. One way is described in our earlier GB Patent Application No. 1821137.5, the contents of which are herein incorporated by reference.

Scan testing is a known technique for detecting faults in processor circuitry, particularly highly embedded processor circuitry. To perform a scan test, a scan chain (of scan latches or scan flops) is provided on the chip such that each scan latch or scan flop can provide input data and record output data from the processor circuitry to be tested. An automatic test pattern generator can generate a bit pattern which is supplied via an input onto the chip and which is then clocked through the scan chain and the logic circuitry on chip using a processor clock. The output is detected and compared with an expected output for the input pattern. Scan testing is highly effective at detecting that there are faults in on-chip processor circuitry, even when that circuitry is highly embedded.

A different kind of test—a so-called functional test—can also be used to detect faults in a processor chip. Such a functional test operates by applying test software to the chip and looking for expected software operations.

SUMMARY

A scan test of a chip can be used to determine if the chip needs to be repaired. If the chip is found to contain a fault, functional tests can be used to localise the likely fault in the chip and indicate which part of the chip needs to be repaired. For example, a processing unit may be identified as defective and may need to be "repaired out". It would be desirable in that context to carry out a scan test after the repair, to confirm that there were no remaining issues in the chip. However, in a scenario where the scan chain passed through both good and defective processing units, a scan test would still show up an error, even though the processing unit would no longer be used in operation of the chip.

Moreover, in the context of a situation where exchange paths on an exchange fabric are directly associated with particular processing units, such exchange paths may also not be utilised if a processing unit has been repaired out. It would be advantageous to therefore ensure that subsequent scan tests (after repair) no longer used scan chains which passed through paths of the exchange associated with the repaired out processing units.

There may be situations in which parts of the exchange are found to be defective. The processing unit associated with the defective part of the exchange is repaired out so that data signals are not processed by the repaired out processing unit, nor are they passed along the faulty parts of the exchange. In such a situation, it is important to ensure the subsequent scan test does not use the faulty exchange elements as elements of the scan chain as the use of these would cause the scan test to fail.

One objective is to enable a scan test to be carried out after a chip has been repaired, such that the scan test avoids repaired out parts of the process According to a first aspect, there is provided a processor comprising: an exchange comprising a plurality of exchange paths for transmitting data between the processing units, each exchange path comprising a set of exchange path portions; a plurality of columns, each column comprising a plurality of processing units, each processing unit connected to output data to a respective exchange path, each column further comprising column pipe circuitry for providing a controllable path between the exchange and the processing units of the column, the column pipe circuitry comprising a column wrapper chain for preventing a scan test signal from passing between the exchange paths of the exchange and the processing units of the column; and a plurality of exchange scan chains for enabling a scan test of the exchange paths of the exchange, each exchange scan chain comprising a plurality of scan chain segments, each scan chain segment comprising an exchange path portion connected to at least one of the processing units of at least one of the columns of the processor.

In some embodiments, at least one of the plurality of exchange scan chains may be an exchange wrapper chain configured to prevent a scan test signal from passing between the scan chain segments associated with the processing units of one of the plurality of columns and the remaining scan chain segments of the exchange.

According to a second aspect, there is provided a processor comprising: an exchange comprising a plurality of exchange paths for transmitting data between the processing units, each exchange path comprising a set of exchange path portions; a plurality of columns, each column comprising a plurality of processing units, each processing unit connected to output data to a respective exchange path, each column further comprising column pipe circuitry for providing a controllable path between the exchange and the processing units of the column; and a plurality of exchange scan chains for enabling a scan test of the exchange paths of the exchange, each exchange scan chain comprising a plurality of scan chain segments, each scan segment comprising an exchange path portion connected to at least one of the processing units of at least one of the plurality of columns of the processor, wherein at least one of the plurality of exchange scan chains is an exchange wrapper chain configured to prevent a scan test signal from passing between the scan chain segments associated with the processing units of at least one of the columns and the remaining scan chain segments of the exchange.

According to a third aspect there is provided a hardware processor comprising:
- an exchange comprising a plurality of exchange paths for transmitting data between processing units, each exchange path comprising a set of exchange path portions;
- a plurality of groups of processing units, each group comprising a plurality of processing units, each processing unit connected to output data to a respective one of the plurality of exchange paths,
- each group further comprising pipe circuitry for providing a controllable path between the exchange and the processing units of the group, the pipe circuitry comprising a wrapper chain for preventing a scan test signal from passing between the exchange paths of the exchange and the processing units of the group; and
- a plurality of exchange scan chains for enabling a scan test of the exchange paths of the exchange, each exchange scan chain comprising a plurality of scan chain segments, each scan chain segment comprising an exchange path portion segment connected to at least one of the processing units of the hardware processor.

In some embodiments, each group is a column.

In some embodiments, the pipe circuitry may comprise a column wrapper chain for preventing a scan test signal from passing between the exchange paths of the exchange and the processing units of the first column. The pipe circuitry may be column pipe circuitry.

In some embodiments, each column of the processor may be associated with a slice of the exchange, each slice of the exchange comprising a portion of each exchange path connected to the processing units of the column associated with the slice.

In some embodiments, each slice may be associated with two columns.

In some embodiments, the exchange wrapper chain may be arranged to prevent the scan test signal from passing between the portions of the exchange paths of the slice and the remaining portions of the exchange.

In some embodiments, the exchange wrapper chain may be arranged at an extremity of the slice of the exchange.

In some embodiments, each slice may comprise two exchange wrapper chains.

In some embodiments, the column wrapper chain may comprise a plurality of wrapper flops arranged to prevent the scan test signal from passing between the column pipe circuitry and the processing units of the column.

In some embodiments, the plurality of wrapper flops may comprise a wrapper flop associated with each of the processing units of the column.

In some embodiments, the column pipe circuitry may comprise a set of input circuitry, through which data passes from the exchange to the processing units during computation, and a set of output circuitry, through which data passes from the processing units to the exchange during computation, wherein each of the set of input circuitry and the set of output circuitry comprising a respective column wrapper chain.

In some embodiments, the set of input circuitry may comprise a plurality of flops arranged in rows, each row associated with one of the processing units of the first column, the wrapper flops arranged before a first flop of each row, such that data is first received from the exchange during computation at the wrapper flop before being received at the first flop of the row.

In some embodiments, the set of output circuitry may comprise a plurality of flops arranged in rows, each row associated with one of the processing units of the first column, the wrapper flops arranged after a last flop of each row, the last flop being the flop of the row at which data is last received before being passed to wrapper flop and then to the exchange during computation.

In some embodiments, a signal input of each of the wrapper flops of the column wrapper chain may be connected to another wrapper flop of the column wrapper chain and not to any of the plurality of wrapper flops.

BRIEF DESCRIPTION OF THE DRAWINGS

For a better understanding of the present disclosure and to show how the same may be carried into effect reference will now be made by way of example to the following drawings.

DETAILED DESCRIPTION

The present disclosure concerns repairing an exchange of a processor chip having multiple processing units and scan testing of the processor chip both before and after repair of the chip. A scan test of the chip can be used to determine if the chip contains a faulty element. Functional testing can be utilised to identify that there is a fault in a specific part of the chip. The chip may be repaired, for example, as described herein by replacing a defective processing unit by a functioning processing unit, or replacing a processing unit associated with a defective part of the exchange by one associated with a functioning part. The repair may be confirmed by a post-repair functional test. However, a scan test of the repaired chip may still fail as the scan test circuitry through which a test pattern is propagated may include scan chains on the defective (but repaired out) processing unit or its associated parts of an exchange.

Embodiments of the present disclosure provide circuitry and techniques which enable a faulty exchange to be repaired and a scan test of a repaired chip to successfully pass, by bypassing scan chains within the defective processing unit which was repaired out and the segments of the scan chain within the exchange which are associated with the repaired out processing unit, the processing units having been repaired out to remove a faulty processing unit and/or fault part of the exchange from functional operation.

The circuitry and techniques are described herein in the context of a so-called intelligence processing unit (IPU) developed by Graphcore and described for example in earlier U.S. application Ser. No. 15/885,925, the contents of which are herein incorporated by reference. It will nevertheless be apparent that the circuitry and techniques described herein may be utilised in other processor chips with multiple processing units.

Figure 1:
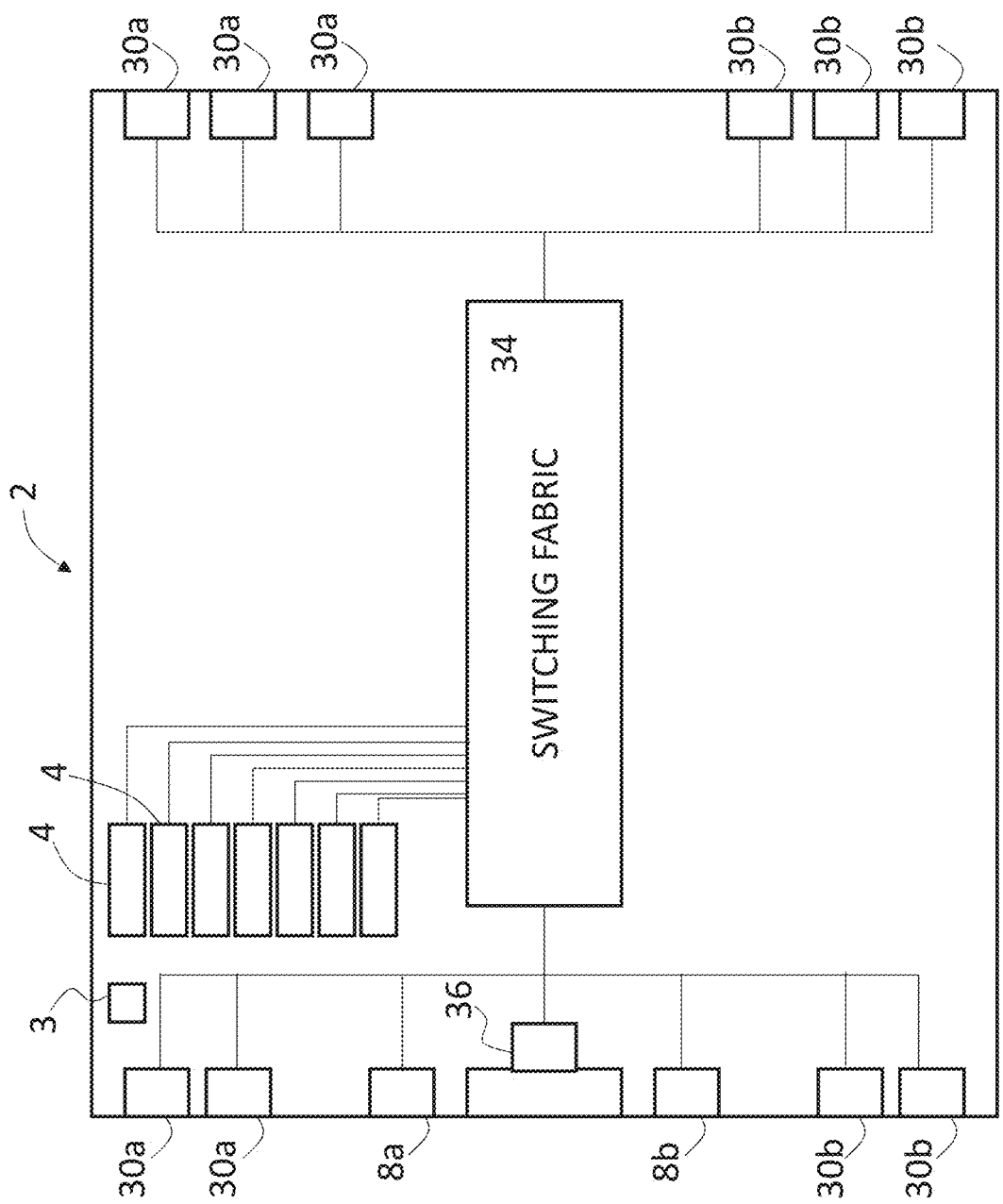
FIG. 1 illustrates schematically the architecture of a single chip processor.

FIG. 1 illustrates schematically the architecture of a single chip processor 2. The processor is referred to herein as an IPU (Intelligence Processing Unit) to denote its adaptivity to machine intelligence applications. The single chip processors can be connected together using links on the chip to form a computer. The processor 2 comprises multiple processing units referred to as tiles. In one embodiment, there are 1216 tiles organised in eight 'slices'. Each slice comprises an upper column and a lower column, where upper and lower are referenced with respect to a horizontally extending exchange. In the described example, there are eight 'upper' columns each of 80 tiles arranged in 20 supertiles and eight similar 'lower' columns. It will be appreciated that the concepts described herein extend to a number of different physical architectures—one example is given here to aid understanding. The chip 2 has two chip to host links 8a, 8b and 4 chip to chip links 30a, 30b arranged on one edge of the chip 2. The chip 2 receives work from a host (not shown) which is connected to the chip via one of the chip-to-host links in the form of input data to be processed by the chip 2. The chips can be connected together into cards by a further six chip-to-chip links 30a, 30b arranged along the other edge of the chip. A host may access a computer which is architected as a single chip processor 2 as described herein or a group of multiple interconnected single chip processors 2 depending on the workload from the host application.

The chip 2 has a clock 3 which controls the timing of chip activity. The clock is connected to all of the chip's circuits and components. The chip 2 comprises an exchange 34 made up of sets of connection wires to which all tiles and links are connected. A set comprises 32 data wires plus control wires, e.g. a valid bit, and provides an exchange path. Each set can carry a 32-bit data packet, but note herein that the word "packet" denotes a set of bits representing a datum (sometimes referred to herein as a data item), perhaps with one or more valid bit. The "packets" do not have headers with destination identifiers which permit an intended recipient to be uniquely identified, nor do they have end-of-packet information. Instead, they each represent a numerical or logical value input to or output from a tile. Each tile has its own local memory. The tiles do not share memory. The exchange comprises a cross set of connection wires connected to multiplexers and tiles as described later and which does not hold any program visible state. Data exchange between tiles is conducted on a time deterministic basis. Each pipelined connection wire comprises a series of temporary stores, e.g. latches or flip flops which hold datum for a clock cycle before releasing it to the next store. Time of travel along each wire of the exchange is determined by these temporary stores, each one using up a clock cycle of time in a path between any two points. The connection wires of the exchange are organised in rows or blocks, each block being associated with a respective column. The connection wires and their latches or flops are sometime referred to herein as hpipes (because they act as horizontal pipelines).

During testing, the flip flops of the exchange act as scan flops of a scan chain. That is, no additional circuitry is required in the exchange to form a scan chain. Instead of connecting to the data input, as is done during exchange of data between tiles in functional operation, a scan input of the flops is connected such that the scan data passes through the flops of the exchange. The scan chains of the exchange begin and end at an embedded deterministic test (EDT) module in column pipes of the columns.

In the embodiment described above, there are 80 tiles in each of 16 columns, arranged in 20 supertiles per column. In another embodiment, there are 96 tiles per column arranged in 24 supertiles. In that embodiment, there are six horizontal pipes in an exchange row, each with twenty-five input scan chain ports (twenty-five ports for chains looping back in the other direction).

Figure 2:
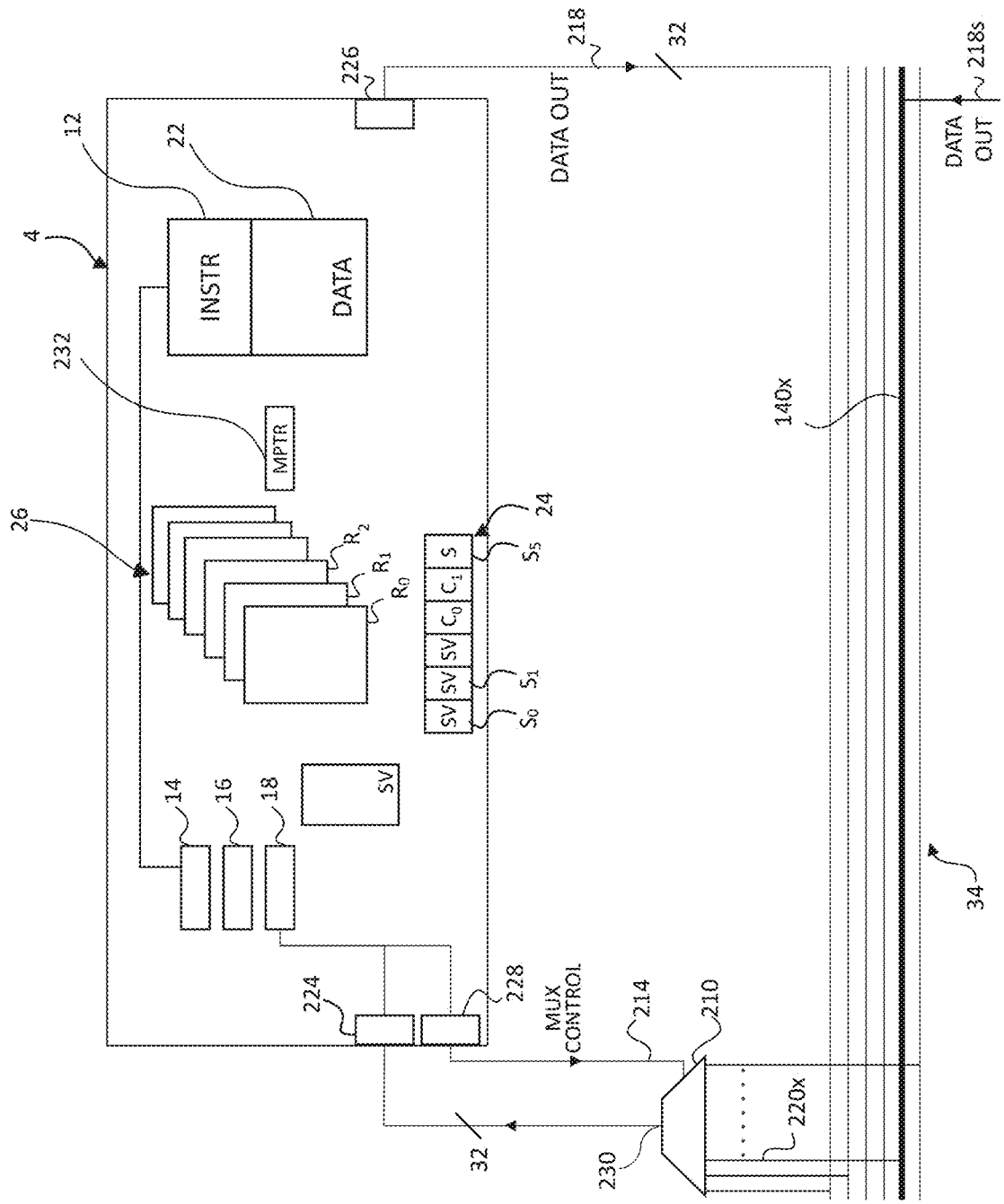
FIG. 2 is a schematic diagram of a tile connected to the switching fabric.

FIG. 2 illustrates an example tile 4 in accordance with embodiments of the present disclosure. In the tile, multiple instruction threads are interleaved through a single execution pipeline. The tile 4 comprises: a plurality of contexts 26 each arranged to represent the state of a different respective one of a plurality of threads; a shared instruction memory 12 common to the plurality of threads; a shared data memory 22 that is also common to the plurality of threads; a shared execution pipeline 14, 16, 18 that is again common to the plurality of threads; and a thread scheduler 24 for scheduling the plurality of threads for execution through the shared pipeline in an interleaved manner. The thread scheduler 24 is schematically represented in the diagram by sequence of time slots $S_0 \ldots S_5$, but in practice is a hardware mechanism managing program counters of the threads in relation to their time slots. The execution pipeline comprises a fetch stage 14, a decode stage 16, and an execution stage 18 comprising an execution unit (EXU) and a load/store unit (LSU). Each of the contexts 26 comprises a respective set of registers $R_0$, $R_1$ . . . for representing the program state of the respective thread. The circuitry of these stages may be scan tested using scan chains within each tile (not shown in FIG. 2).

As briefly mentioned above, data is exchanged between tiles in the chip. Each chip operates a Bulk Synchronous Parallel protocol, comprising a compute phase and an exchange phase. In the exchange phase, there are no computations: each datum moves along the connection wires on which it exits a tile from a transmitting tile to one or multiple recipient tile(s). At each clock cycle, datum moves a certain distance along its path (store to store), in a pipelined fashion, under control of the clock. When a datum is issued from a tile, it is not issued with a header identifying a recipient tile (although the datum may include a header indicating at least one direction of travel through the switching fabric 34). Instead, the recipient tile knows that it will be expecting a datum from a certain transmitting tile at a certain time. Thus, the computer described herein is time deterministic. Each tile operates a program which has been allocated to it by the programmer or by a compiler function, where the programmer or the compiler function has knowledge of what will be transmitted by a particular tile at a certain time and what needs to be received by a recipient tile at a certain time. In order to achieve this, SEND instructions are included in the local programs executed by the processor on each tile, where the time of execution of the SEND instruction is predetermined relative to the timing of other instructions being executed on other tiles in the computer.

Each tile 4 is associated with its own multiplexer 210: thus, the chip of the present embodiment has 1216 multiplexers. Each tile is connected to its associated multiplexer 210 via an input wire 217 over which it is configured to receive a datum. Each multiplexer has 1216 inputs, each input being 32-bits wide (plus optionally some control bits). Each input is connected to a respective set of connecting wires $140_x$ in the exchange 34. The connecting wires of the switching fabric are also connected to a data out set of connection wires 218 from each tile, thus there are 1216 sets of connecting wires which in this embodiment extend in a direction across the chip. For ease of illustration, a single emboldened set of wires $140_x$ is shown connected to the data out wires $218_s$, coming from a tile, not shown in FIG. 2, in the lower group of columns. This set of wires is labelled 140, to indicate that it is one of a number of sets of crosswires $140_0$_$140_{1546}$. As can now be seen from FIG. 2, it will be appreciated that when the multiplexer 210 is switched to the input labelled $220_x$ then that will connect to the crosswires $140_x$ and thus to the data out wires 218, of the tile (not shown in FIG. 2) in the lower group of columns. If the multiplexer is controlled to switch to that input $220_x$ at a certain time, then the datum received on the data out wires which is connected to the set of connecting wire $140_x$ appears at the output 230 of the multiplexer 210 at a certain time. It arrives at the tile 4 a certain delay after that, the delay depending on the distance of the multiplexer from the tile. The multiplexers form part of the switching fabric which includes the exchange 34. The delay from the tile to the multiplexer can vary depending on the location of the tile. To implement the switching, the local programs executed on the tiles include switch control instructions (PUTi-MUXptr) which cause a multiplexer control signal 214 to be issued to control the multiplexer associated with that tile to switch its input at a certain time ahead of the time at which a particular datum is expected to be received at the tile. In the exchange phase, multiplexers are switched and packets (data) are exchanged between tiles using the switching fabric. It is clear from this explanation that the switching fabric has no state—the movement of each datum is predetermined by the particular set of wires to which the input of each multiplexer is switched.

Each tile has three interfaces:
an exin interface 224 which passes data from the switching fabric 34 to the tile 4;
an exout interface 226 which passes data from the tile to the switching fabric over the broadcast exchange bus 218; and
an exmux interface 228 which passes a control mux signal 214 (mux-select) from the tile 4 to a multiplexer 210 associated with it.

Figure 5:
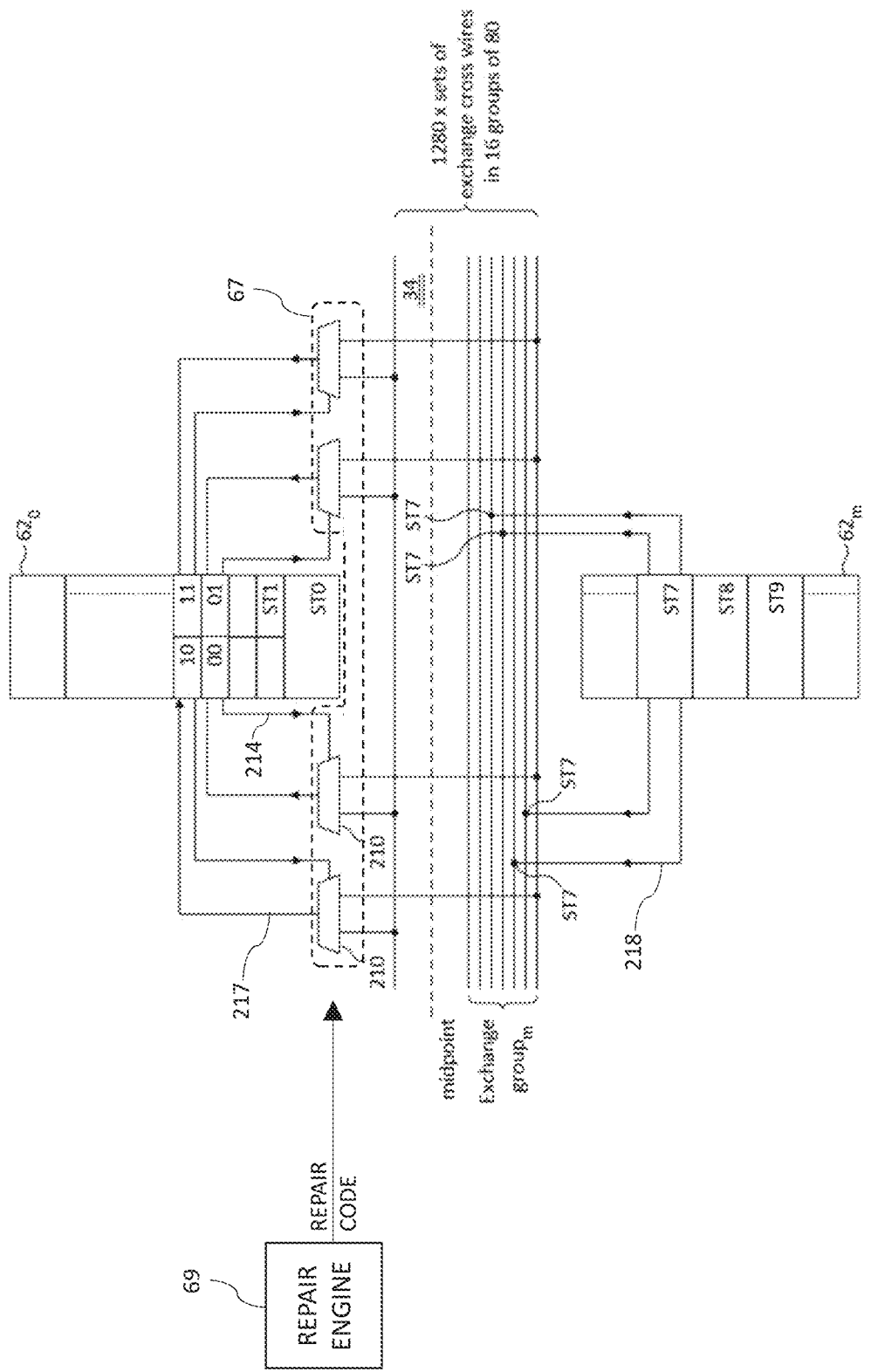
FIG. 5 is a schematic diagram illustrating columns on opposed sides of an exchange to illustrate tile and multiplexer repair.

Reference is made to FIG. 5, which illustrates an example of the layout of columns on the processor chip 2, illustrating the arrangement of tiles 4 on the chip in more detail. Each tile 4 is part of a set of four tiles, referred to as a supertile 61. For simplicity, only a few of the supertiles 61 shown in FIG. 5 are shown divided into their constituent tiles.

In one embodiment, each column 62 comprises twenty supertiles 61, numbered $ST_0$ to $ST_{19}$ (80 tiles in total).

As described above, each tile 4 has a 32 bit input connection 217, and 32 bit output connection 218. As noted, the tile 4 knows (because it is defined in the sequence of instructions compiled for the tile) that it will be expecting a datum from a certain transmitting tile at a certain time, and executes a PUTi-MUXptr instruction, to control the multiplexer to switch at a certain time to the input connected to the set of connecting wires 140 which is connected to the output 218 of the sending tile. This ensures that the datum will appear at the output 230 of the multiplexer 210 at the time that the receiving tile is expecting to receive it.

The multiplexer 210 receives a multiplexor control signal on the control line 214 which identifies a unique tile identifier indicating where that multiplexor should 'point'. That is, to which set of cross wires on the exchange 34 should that multiplexer connect in order to 'listen to' the tile from which a transmission is expected at that time.

FIG. 5 shows two multiplexers connected to supertile ST2 on the 'east' side of the column, and two multiplexers connected to supertile ST2 on the 'west' side of the column. For the sake of clarity, no other multiplexers or connection lines are shown in FIG. 5, but it will be appreciated that there are two multiplexers for each supertile on each side of the column, making a total of forty multiplexors on the east side and forty multiplexors on the west side in the embodiment where each column has 20 supertiles. Each multiplexor should be capable of connecting to any of the sets of exchange cross wires (hpipes) in the exchange fabric 34. In order to implement a 1216 way multiplexer, in such a manner that repair can be implemented efficiently, each multiplexer 210 comprises 32 40-way multiplexer slices. The number of 32 has been chosen to match the number of half-columns in the array. Note that this number may be varied as the number of columns is varied in any particular processor architecture. However, in preferred embodiments there is one n-way multiplexer slice per half-column. Each multiplexer 210 comprises a decode block which receives the MUX control signal on line 214. The decode block receives the unique tile identifier of the transmitting tile on MUX control line 214 via a codec interface. The decode block selects one of the 32 multiplexor slices based on column identifier bits in a tile identifier. Then, the least significant bit of the tile identifier indicates whether an eastern set of inputs or a western set of inputs of that multiplexer slice is to be selected (depending on whether the transmitting tile is on the east or west side of the transmitting column). Then, the supertile identifying bits of the tile identifier are used to select one of 20 inputs in the East or Western slice of the multiplexer 1210. In that way, a particular input is selected at the time at which a message from the transmitting tile is expected to be received at the receiving tile in a time deterministic fashion as described earlier.

The multiplexers and decode block are provided at the base of each column in column pipe circuitry, which also includes other components not discussed herein which manage aspects of column repair.

As explained earlier with reference to FIG. 1, a large number of tiles are present on each processing chip. In one embodiment, there are 1216 tiles on a single chip. Since there may be interdependency between the tiles, i.e. the processing performed on one tile may be dependent on the results of processing on another tile, which is determined by the compiler, it is important that each tile on the processing chip be tested in order to determine whether each tile is fully functional. If there is a fault with a tile, that tile cannot be allocated any code for execution. What is desired is code-generated by the compiler which can be loaded into any chip having a certain predefined architecture, regardless of which tile(s) on that chip might be faulty. Techniques described in our earlier application U.S. Ser. No. 16/419,535 and concisely described herein, enable the repair of the chip to accommodate faulty tiles to be agnostic to the compiler. The contents of U.S. Ser. No. 16/419,535 are incorporated herein by reference. All the compiler needs to know is the chip architecture, and it can assume that any chip has been repaired in conformance with the same chip architecture, using the technique described herein.

As noted, it is necessary to perform testing of all of the tiles 4 on the chip 2 so as to repair any faults that are detected. This testing comprises running a Built In Self-Test (BIST) mechanism for all of the memory in the chip 2. In response to determining that any of the tiles' memories are determined to be faulty and unrepairable, an indication of this is stored. The indication is provided to a fault detection system, which may be external to the chip 2, or part of the chip 2. Additionally, the testing comprises running a scan test for all of the logic of the tiles 4 on the chip 2 so as to detect any faults. In response to determining that any of the tiles's logic is faulty, an indication of this is stored. Therefore, an indication that one or more faults have occurred for a tile are stored in a repair engine 69. Note that it may be necessary to run only one test—as soon as a tile is detected as having a fault, it cannot be used, and needs to be repaired out. Testing is described in more detail later.

To identify faults in the chip 2, scan chains are used to test the performance of the chip 2. These scan chains may be used to perform two different types of test: scan testing and logic testing, according to predetermined methods, to check the integrity of circuits on the chip.

There are a number of challenges which need to be addressed to improve scan testing in a complex chip as described herein.

A scan chain is provided for each "slice", where a slice comprises two columns in opposite arrays of the chip 2. Referencing FIG. 6, columns 0 and m and their associated circuitry form a single slice.

When a fault is detected, e.g. using functional testing, in a tile 4, the supertile 61 comprising the faulty tile 4 may be repaired as will be discussed later. In summary, a defective supertile is logically replaced by renumbering its physically adjacent supertile in the same column.

Following supertile repair, the chip 2 may be again tested to ensure that it is working correctly, for example by a functional test.

It is desirable to use, in addition, a scan test for the repaired chip.

In addition to performing a functional test after a supertile 61 has been repaired to check the functionality of the repaired chip, it is desirable to perform a further scan to validate the chip 2. If a continuous scan chain is formed through a whole 'slice' the defective supertile is still a component of the scan chain, although it no longer contributes to the processing logic of the chip. Therefore, it is possible that circuits contributing to the failure of the supertile would cause the scan test to fail even after repair.

One aim of the present disclosure is to provide a method for allowing scan testing to be used whether or not a chip has been repaired so that the same quality of testing can be used on repaired and non-repaired chips.

Note from the above that a supertile not only has its own processing circuitry, but is also associated with dedicated logic, including its own exchange paths of the exchange 34.

In order to be able to carry out a scan test on the repaired chip, the exchange logic related to the repaired supertile 61 is eliminated from the scan chain, as is the repaired out supertile 61.

Separate scan tests are performed for testing the exchange circuitry and the column circuitry.

Scan testing is implemented by enabling segments of scan chains within the chip 2 to be switched out when a repair has been made and to stitch together remaining segments to form a different scan testable scan chain after repair.

Figure 11:
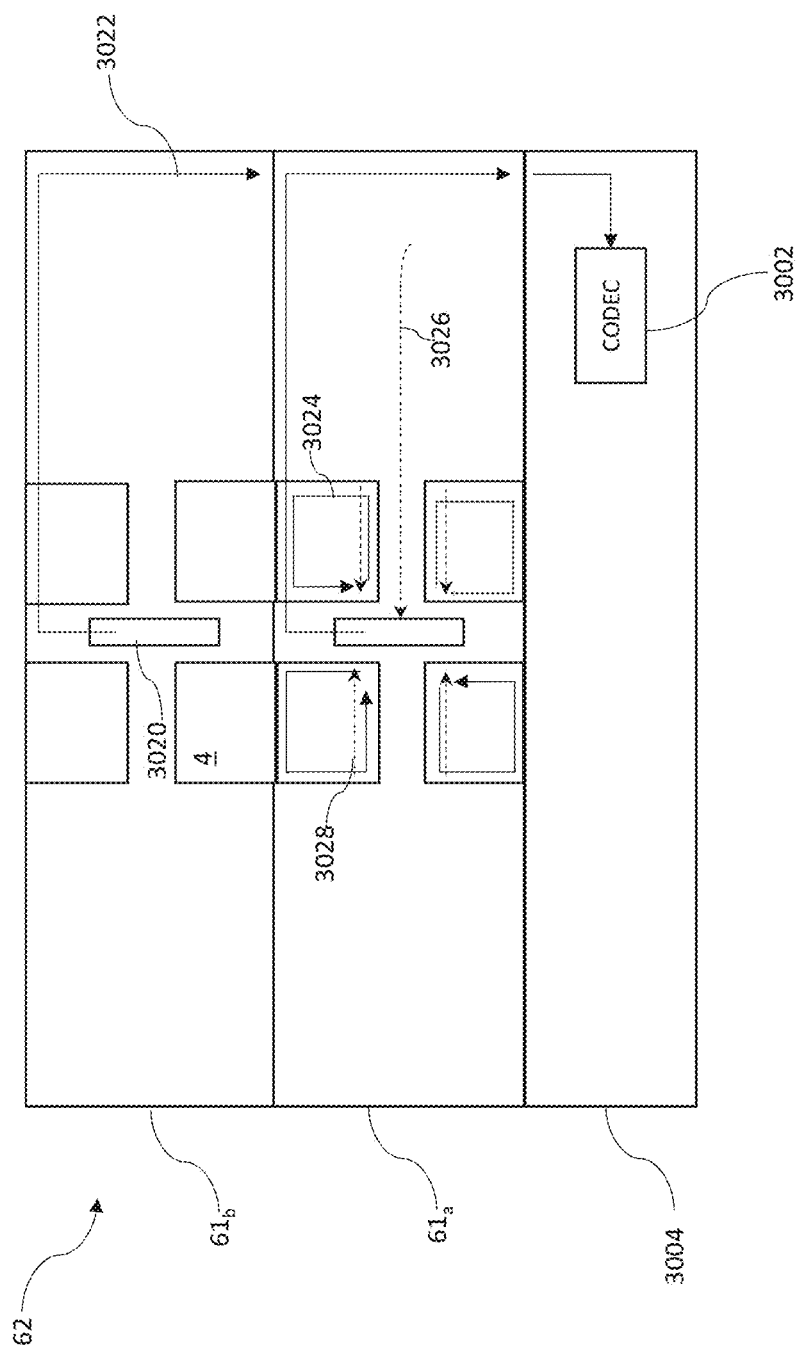
FIG. 11 is a schematic diagram illustrating different scan chains within a column.

FIG. 11 is a schematic diagram illustrating different scan chains within a column 62. Only two supertiles $61_a$, $61_b$ are shown in FIG. 11 for clarity. It will be appreciated that the following description applies to all supertiles 61 of a column 62. At the bottom of the column 62, i.e. the end of the column closest to the exchange, is the column pipe 3004. The codec interface 3002 is situated in the column pipe 3004.

There are two different types of chains: wrapper chains 3022, 3024 and scan chains 3026, 3028. Wrapper chains are similar to scan chain in that they are formed of a series of wrapper flops or latches, and can themselves act as scan chains. The purpose of a wrapper chain is to isolate components during a scan test.

Each tile 4 of the column 62 has a tile scan chain 3028 which tests all of the logic of each tile 4. That is, the tile scan chain 3028 of a tile passes through every scan flop of the tile. The tile scan chains 3028 feed into a design for test (DFT) block 3020, which contains a codec, of the associated supertile $61_a$, $61_b$.

There is also a supertile scan chain 3026 associated with each supertile $61_a$, $61_b$, which passes through the additional circuitry of the supertile $61_a$, $61_b$. The supertile scan chain also feeds into the DFT block 3020. This is the scan chain from the tile memory block.

A tile wrapper chain 3024 associated with each tile 4 of the column 62, and a supertile wrapper chain 3022 is associated with each supertile. The tile wrapper chains 3024 associated with the tiles 4 of a single supertile $61_a$, $61_b$ feed into the DFT block 3020. The supertile wrapper chain 3022 feeds from the DFT block 3020 to the codec 3002.

Each supertile $61_a$, $61_b$ is associated with a single supertile wrapper chain 3022 and four tile wrapper chains 3024. Each supertile wrapper chain 3022 passes its scan data directly to the codec 3002 of the column 62 in which the associated supertile $61_a$, $61_b$ is situated, i.e. there are 20 separate wrapper scan chains 3022 per column 62, assuming a column comprising 20 supertiles as described above.

The wrapper chains 3022, 3024 separates the exchange from the supertiles for the purpose of allowing for scan testing of the exchange without the need to test the columns. This is advantageous as it reduces the length of the scan chain required to test the exchange so allowing for both a quicker and less complex test to be performed. It also allows the exchange to be tested separately. When testing the exchange, the supertile wrapper 3022, 3024 is controlled and observed from the codec exchange 3002, when testing the supertile the wrapper chains 3024 are controlled and observed by the supertile DFT block 3020.

The wrapper chains 3022, 3024 do not provide a complete means for the circuitry of the tiles 4 themselves to be tested. Therefore, the tile scan chains 3028 are also required for testing the tiles 4.

In embodiments of the present disclosure, shuffle logic is introduced which allows scan chain elements associated with defective tiles or defective exchange logic to be ignored and replaced with the scan chain elements associated with the replacement supertile. This allows scan chains of the exchange to be "stitched together" without including the repaired-out supertile or its associated exchange blocks. Scan testing can be implemented which excludes the wrapper chain associated with the repaired-out supertile and its corresponding exchange block.

Two sets of shuffle logic are described below, one set in the exchange and one set in the columns. The shuffle logic allows scan chains to be stitched to include scan chain segments of the supertiles which are to be used during computations. The shuffle logic in the exchange also provides a mechanism for repairing the exchange.

Figure 7:
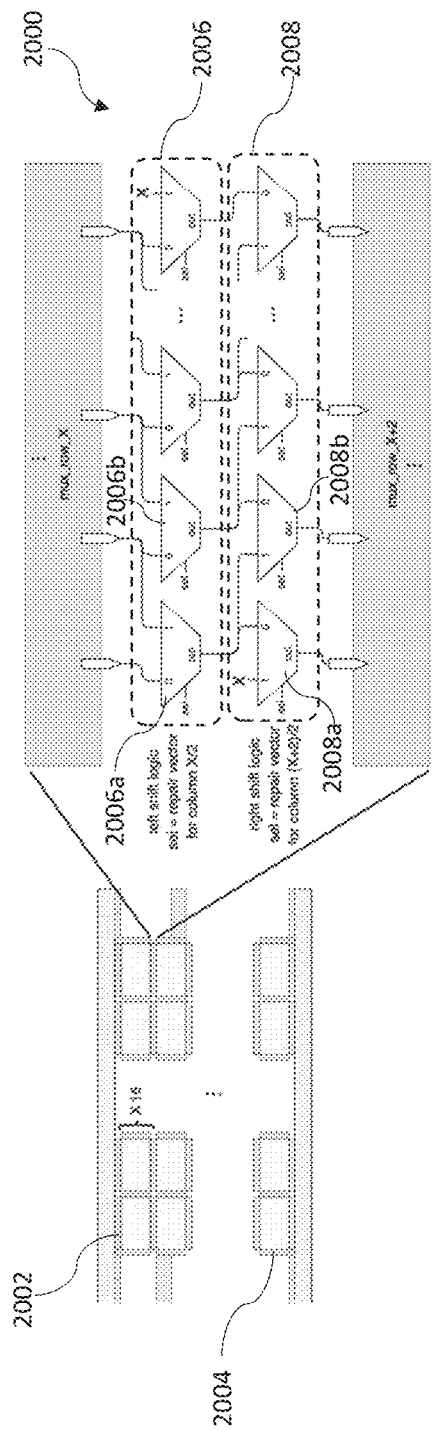
FIG. 7 is a schematic diagram of shuffle logic used to bypass segments of scan chains associated with defective tiles.

FIG. 7 shows shuffle logic 2000 which is introduced to accommodate the switching of the column multiplexers in the context of a repair. The shuffle logic 2000 comprises circuitry which enables scan chains of "redundant" exchange paths to be ignored and replaced with scan chains of the repaired paths, the redundant paths being the exchange paths associated with the repaired-out supertile. The columns 62 each include a "spare" supertile 61. In the event that no repair has taken place, the spare supertile provided is considered the "defective" supertile. That is, the scan chains associated with the spare supertile are switched out. The shuffle logic 2000 is connected between hpipes in the exchange 34.

It will be appreciated that there is an option for all supertiles 61 in the column 62 to be used. That is, there is no redundant supertile. This option is only used if all circuitry of the chip 2 is found to be fully functional following testing of the whole chip 2. If such option is desirable, a scan test of the whole chip 2, i.e. including circuitry associated with all tiles of all columns of the chip, is run, rather than a scan test which exclude the circuitry associated with the spare supertiles In some embodiments there are two sets of exchange scan test patterns. One for no supertiles repaired as in this case, and another for when a supertile is repaired.

The shuffle logic 2000 determines whether each scan chain needs to "shuffle" right, "shuffle" left, or continue straight for the paths of the exchange associated with each column, in both directions. If a chain is "shuffled", a connection between the exchange path and the column is bypassed.

The shuffle logic 2000 is positioned between each horizontal pipe 2004, or path, of the exchange. Each horizontal pipe 2004 contains scan chains. The shuffle logic 2000 is used to stitch the scan chains of neighbouring horizontal pipes 2004 such that the scan chains within the horizontal pipes 2004 associated with any repaired out supertiles are ignored.

The shuffle logic 2000 comprises two stages of multiplexers 2006, 2008. Here, the stages are provided in two rows, the top row, at the output of the horizontal pipe 2004, providing "left-shift" logic 2006 and the bottom row, providing an input to the horizontal pipe, providing "right-shift" logic 2008. Each stage of the shuffle logic 2000 comprises one multiplexer 2006a, 2006b, 2008a, 2008b per supertile in a column 62. This allows shifts to occur at some locations but not at others. For example, if the third supertile of a column has been replaced, there is no shift for the first two supertiles, but a shift is required for the third and subsequent supertiles to ignore the scan chain elements of the exchange associated with the repaired-out third supertile.

The multiplexers of the left-shift logic 2006 are referred to herein as left-shift multiplexers 2006a, 2006b and the multiplexers of the right-shift logic 2008 are referred to herein as right-shift multiplexers 2008a, 2008b.

The multiplexers are each controlled by a select signal "sel". The select signal is derived from a repair vector for each column as described later.

If both multiplexers 2006a, 2008a, 2006b, 2008b associated with a single supertile receive a low select signal, the scan chain continues straight such that the output of the exchange logic of the horizontal pipe block above the shuffle logic 2000 associated with a particular supertile in the corresponding column is the input to the corresponding supertile exchange logic of the horizontal pipe block below the shuffle logic 2000. For example, the output of the exchange logic associated with supertile x of column $62_n$ is in input to the exchange logic associated with supertile x of the column $62_{n+1}$. As will be evident, this is just for the hpipe, the vpipe shuffle logic is done on the complete scan chains 3000a, 3000b within the column pipe as described further herein.

If a left-shift multiplexer 2006a, 2006b has a high select input signal, a left-shift occurs. That is, scan data passing through the left-shift logic is the output of a left-shift multiplexer 2006a, 2006b one to the left of the multiplexer of which the signal was an output prior to entering the shuffle logic 2000. That is, the scan data is effectively shifted one multiplexer to the left.

For example, considering a multiplexer outputting scan data to the two left-most left-shift multiplexers 2006a, 2006b shown in FIG. 7, the scan data is the low input for multiplexer 2006b and the high input for multiplexer 2006a. If a left-shift occurs, the scan data will be the output of the left-most multiplexer 2006a, i.e. the multiplexer to the left of the outputting multiplexer above. However, if there is no left-shift, the scan data is the output of the multiplexer 2006b directly below the outputting multiplexer above.

If a right-shift multiplexer 2008 has a high select input signal, a right-shift occurs. That is, the scan data passing through the right-shift logic 2008 is the output of the right-shift multiplexer 2008a, 2008b one to the right of the left-shift multiplexer 2006a, 2006b from which the signal was an output.

For example, the output of the left-most left-shift multiplexer 2006a is connected to the inputs of the two left-most right-shift multiplexers 2008a, 2008b shown in FIG. 7, the low input for multiplexer 2008a and the high input for multiplexer 2008b. If a right-shift occurs, the multiplexer 2008b selects the high input such that the scan data passes from multiplexer 2006a to 2008b. If, however, there is no right-shift, the multiplexer 2008a selects the low input and the scan data output from 2006a is the input to 2008a.

The shuffle logic 2000 shown in FIG. 7 is that associated with column X. The select signal input to the left-shift multiplexers 2006a, 2006b is the repair vector for column X/2. The select signal input for the right-shift multiplexers 2008a, 2008b is the repair vector for column (X+2)/2. These select signal inputs allow the multiplexers 2006a, 2006b, 2008a, 2008b to output scan data accordingly such that the scan chains associated with the defective supertiles in each of the neighbouring columns is avoided.

Although only one set of shuffle logic 2000, i.e. one left-shift stage 2006 and one right-shift stage 2008, is shown in FIG. 7, it will be appreciated that there is a corresponding set of shuffle logic 2000 associated with each column 62.

The shuffle logic 2000 has the effect of bypassing and replacing the segments of the scan chain associated with defective processing units and/or exchange portions. This allows a scan chain to stay the same length. In the example described herein, there are 16 blocks of the exchange, one associated with each column of the chip. By maintaining a constant scan chain length, DFT can be implemented.

A left- and/or right-shift is implemented in different scenarios.

A left-shift is implemented in order to revert the scan chain back to a layout for if no repair has taken place. That is, if there has been an adjustment due to a repair in the horizontal pipe block from which the scan data enters the left-shift logic 2006, a left-shift is implemented for the relevant supertiles such that the scan data appears at the output of the multiplexers 2006a, 2006b associated with the first 19 supertiles, i.e. the left-shift multiplexer associated with the final supertile in the column has no output. If no repair has taken place in the supertile associated with the horizontal pipe block from which the scan data is output, the scan chain is already arranged in the no repair layout. In such a case, no left-shift is implemented.

A right-shift is implemented if there has been an adjustment due to repair in the horizontal pipe block to which the right-shift logic 2008 outputs. That is, if a supertile of the column corresponding to the horizontal pipe block at the output of the shuffle logic 2000 has been repaired, the scan chains are shifted right for the supertiles which have been renumbered. This has the effect of altering the layout (connection between segments) of the scan chains from the no repair layout to a layout corresponding to the repair which has occurred in the corresponding column. If no repair has occurred in this column, no right-shift is implemented such that the scan chain remains in the no repair layout.

The two layers of the shuffle logic 2000 are implemented between each horizontal pipe 2004 in each direction. That is, between a pair of horizontal pipes 2004, there is shuffle logic 2000 as shown in FIG. 7 and an identical set of shuffle logic 2000 but implemented for passing scan data from the horizontal pipe show at the bottom of FIG. 7 to that shown at the top of FIG. 7.

The shuffle logic 2000 shown in FIG. 7 is positioned between two horizontal pipes 2004 associated with two different columns 62 of the chip 2. It will be appreciated that the left-shift logic 2006 and right-shift logic 2008 do not have to be provided together.

At the ends of the exchange, only one row of shuffle logic 2000 is required in each direction. Using the example of the scan data traveling from north to south, as for the shuffle logic 2000 shown in FIG. 7, only right-shift logic 2008 is required before the horizontal pipe 2004 at the north end of the exchange and only left-shift logic 2006 is required after the horizontal pipe at the south end of the exchange. This is because the scan data is input to the exchange as if no repair has taken place, such that only logic for accommodating for any repairs in the first column is required, and the scan data must be returned to the locations for if no repair has taken place when leaving the exchange, such that only logic for accommodating repairs in the final column is required.

Figure 8:
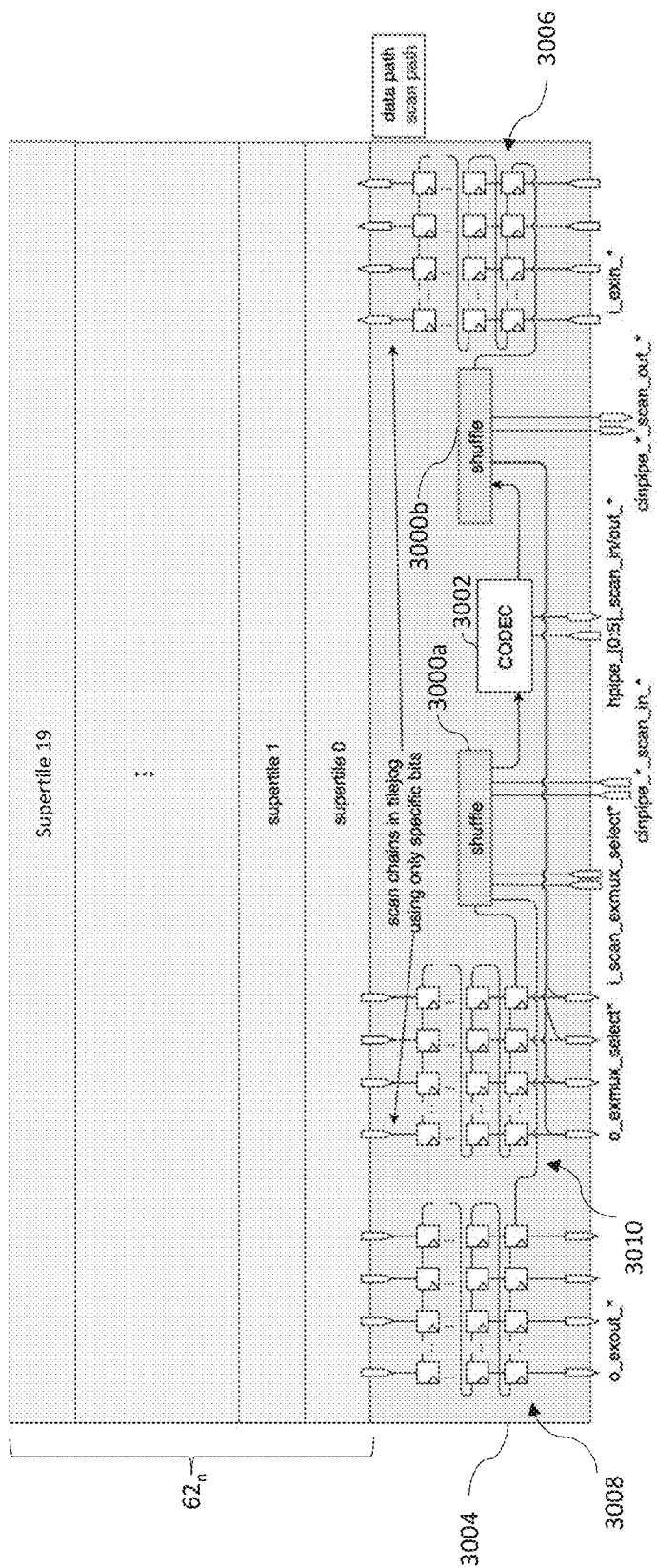
FIG. 8 is a schematic diagram of shuffle logic used to bypass whole scan chains associated with columns.

The scan data for use in the shuffle logic 2000 originates at the codec interface 3002 located in the column pipe 3004, as shown in FIG. 8. The scan data passes through one length of the shuffle logic 2000 before being passed to the codec interface 3002 of the opposite column.

The shuffle logic 2000 described above is required due to the layout of the exchange. The horizontal pipes 2004 of the exchange are stacked on top of each other. This is to minimise the space requirements of the exchange, and so the chip. This layout means that it is not possible to have individual scan chains for each horizontal pipe block 2004 associated with each column of the chip.

In addition to the shuffle logic 2000 placed between the horizontal pipe blocks, column shuffle logic 3000a, 3000b is provided in the column pipes 3004 at the codec interface 3002. The column shuffle logic 3000a, 3000b for a single column $62_n$ is shown in FIG. 8.

The column shuffle logic 3000a, 3000b is used to bypass a repaired out supertile during a scan test. More specifically, the column shuffle logic 3000a, 3000b bypasses a wrapper chain 3022 during an exchange scan test and a supertile scan chain 3026 during a column or full chip scan test.

The column shuffle logic 3000a, 3000b comprises a single layer of multiplexers. Unlike the shuffle logic 2000 positioned between horizontal pipe blocks, the column shuffle logic 3000a, 3000b can only shuffle the scan chain in a single direction. Only a single layer is required because the scan chain only needs to be shuffled in one direction.

The description uses the example of an exchange scan test.

The column pipe 3004 comprises input column circuitry 3006 output column circuitry 3008 and select column circuitry 3010. These three sets of circuitry 3006, 3008, 3010 as shown in FIG. 8 are associated with a single supertile of the column 62. It will be appreciated that equivalent sets of circuitry 3006, 3008, 3010 are provided in the column pipe 3004 for each of the supertiles of the column 6n. These have not been shown for clarity purposes.

The sets of column circuitry 3006, 3008, 3010 comprise flops, which are arranged in rows and columns.

During functional operation, the input column circuitry 3006 receives data from the exchange. The data is received at the input of the set of the input column circuitry 3006 corresponding to the supertile from which the data signals are received. That is, the inputs to the input column circuitry are each connected to a different crosswire of the exchange.

Similarly, during functional operation, the output column circuitry 3008 transfers data from the tiles of the column $62_n$ to the exchange. The select column circuitry 3010 is used to pass control signals from the tiles 4 to their associated multiplexers 210 for selecting the input crosswire of the exchange.

Two different sets of scan data are used when testing the column circuitry: vertical pipe scan data (referenced as cinpipe_scan in FIG. 8) and exchange multiplexer select scan data (referenced as scan_exmux_select in FIG. 8.

Both sets of scan data are inputs of input shuffle logic 3000a. The scan data is passed from the input shuffle logic 3000a to the codec interface 3002 and then to output shuffle logic 3000b. the scan data is then passed to the input column circuitry 3006. The scan data originates in the EDT block associated with the codec in the column_pipe.

The scan data is input first to a first flop of a first row of the input column circuitry 3006. The scan chain is stitched such that the scan data passes through each first flop of each column of the input column circuitry, the first flop of each column being the flop closest to the exchange in each column of the input column circuitry 3006. The output of the first flop of the final column is passed to the second flop of the first column, and the scan chain passes through the second flop of each of the columns, and so on such that the scan chain comprises each flop of the input column circuitry 3006.

The output of the final flop of the final column of input column circuitry 3006 is connected to the scan circuitry of the supertile associated with the input shuffle logic. In the case of the exchange scan test, the scan data is passed to the wrapper chain 3022 of the associated supertile.

Once the vertical pipe scan data has passed through the wrapper chain 3022 of the associated supertile, it is passed to a final flop of a final row of the output column circuitry 3008. The scan chain is stitched within the output column circuitry such that the vertical pipe scan data is passed from the final flop of the final column, to the final flop of the penultimate column, and so on until the vertical pipe data reaches the first flop of the first column. That is, the scan chain follows the reverse order of that in the input column circuitry 3006.

After the first flop of the first row of the output column circuitry 3008, the vertical column scan data is passed to the output shuffle logic 3000b via the input shuffle logic 3000a and the codec interface 3002.

Once the exchange multiplexer select scan data has passed through the wrapper chain 3022 of the supertile, this scan data is passed to a final flop of a final row of the select column circuitry 3010. The scan chain in the select column circuitry 3010 is stitched in the same order as that of the output column circuitry 3008. Once the scan data has passed through all flops of the select column circuitry 3010, the scan data is passed to the output shuffle logic 3000b via the input shuffle logic 3000a and the codec interface 3002.

Both sets of scan data are then passed through the scan chains associated with the next supertile in the column to be used in computations. That is, the scan data is passed through each flop of the input column circuitry 3006 associated with the next supertile of the column, before being passed to the wrapper chain 3022 of that supertile. The vertical pipe scan data is then passed through each flop of the output column circuitry 3008 of said supertile while the exchange multiplexer select scan data is passed through each of the flops of the select column circuitry 3010 of said supertile. Both sets of scan data are again passed through the input shuffle logic 3000 and codec interface 3002 to the output shuffle logic 3000b.

The two sets of scan data are passed through all flops of the column circuitry 3006, 3008, 3010 and each wrapper chain 3022 associated with each supertile to be used during exchange of data between tiles in functional operation. That is, the scan data is used to test only those supertiles and their associated circuitry 3006, 3008, 3010 which are to be used, such that is there is a repaired out supertile, the scan data does not pass through the wrapper chain 3022 or column circuitry 3006, 3008, 3010 associated with the repaired out supertile.

Once the scan data has passed through all of the circuitry it is being used to test and has been passed back to the output shuffle logic 3000b, the output shuffle logic 3000b outputs the vertical pipe scan data to the codec 3002. The output shuffle logic 3000b outputs the exchange multiplexer select scan data via the outputs of the select column circuitry 3010. The same scan data could be used for the other column in the slice, but may be different for columns in the other slices.

The shuffle logic 3000a, 3000b is used to avoid the circuitry 3006, 3008, 3010 and the wrapper chain 3022 associated with the repaired our supertile. As discussed above, the shuffle logic 3000a, 3000b comprises a single layer of multiplexers.

Figure 9:
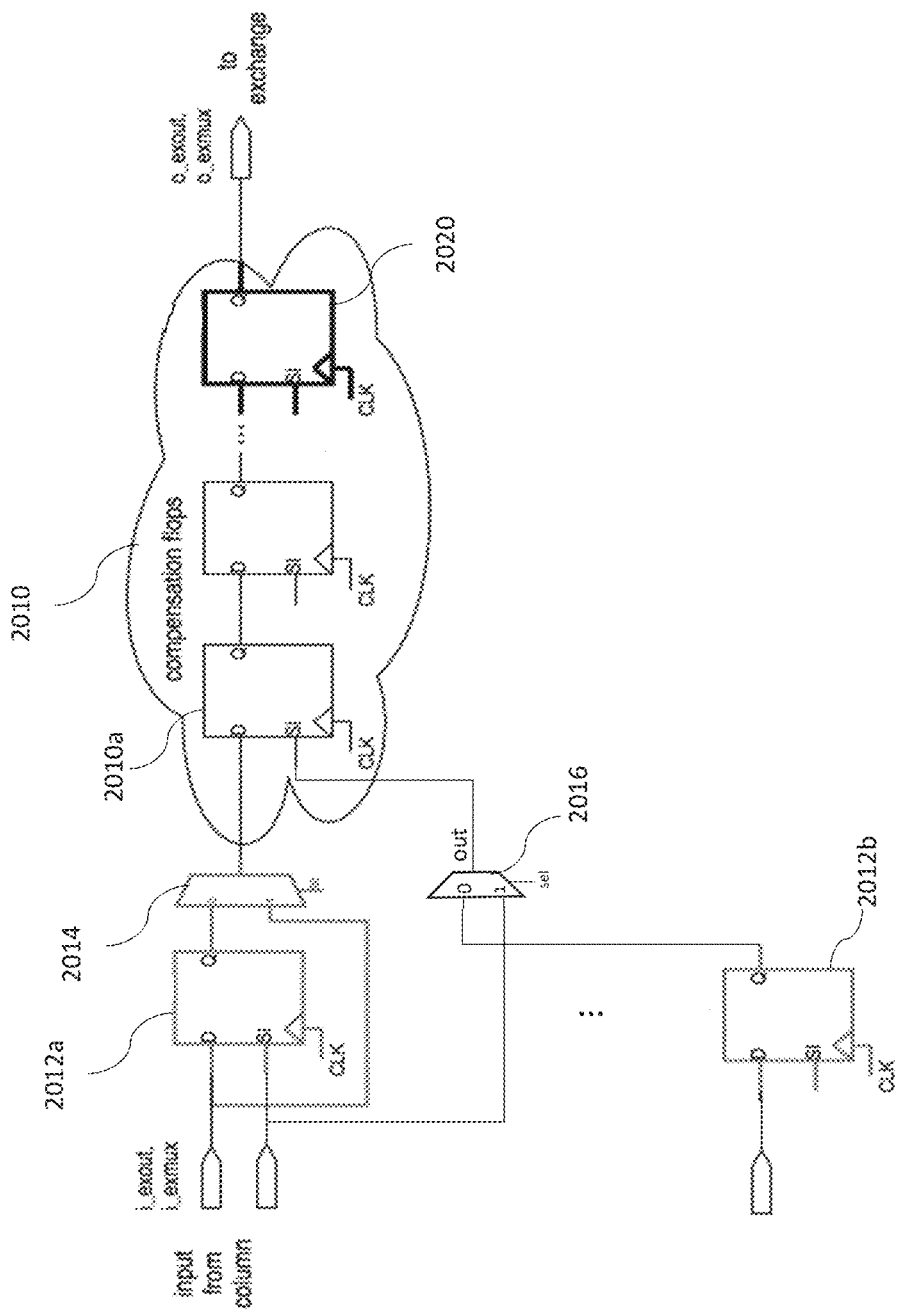
FIG. 9 is a schematic diagram of column pipe circuitry for passing data from tiles and bypassing the circuitry in case of repair.
Figure 10:
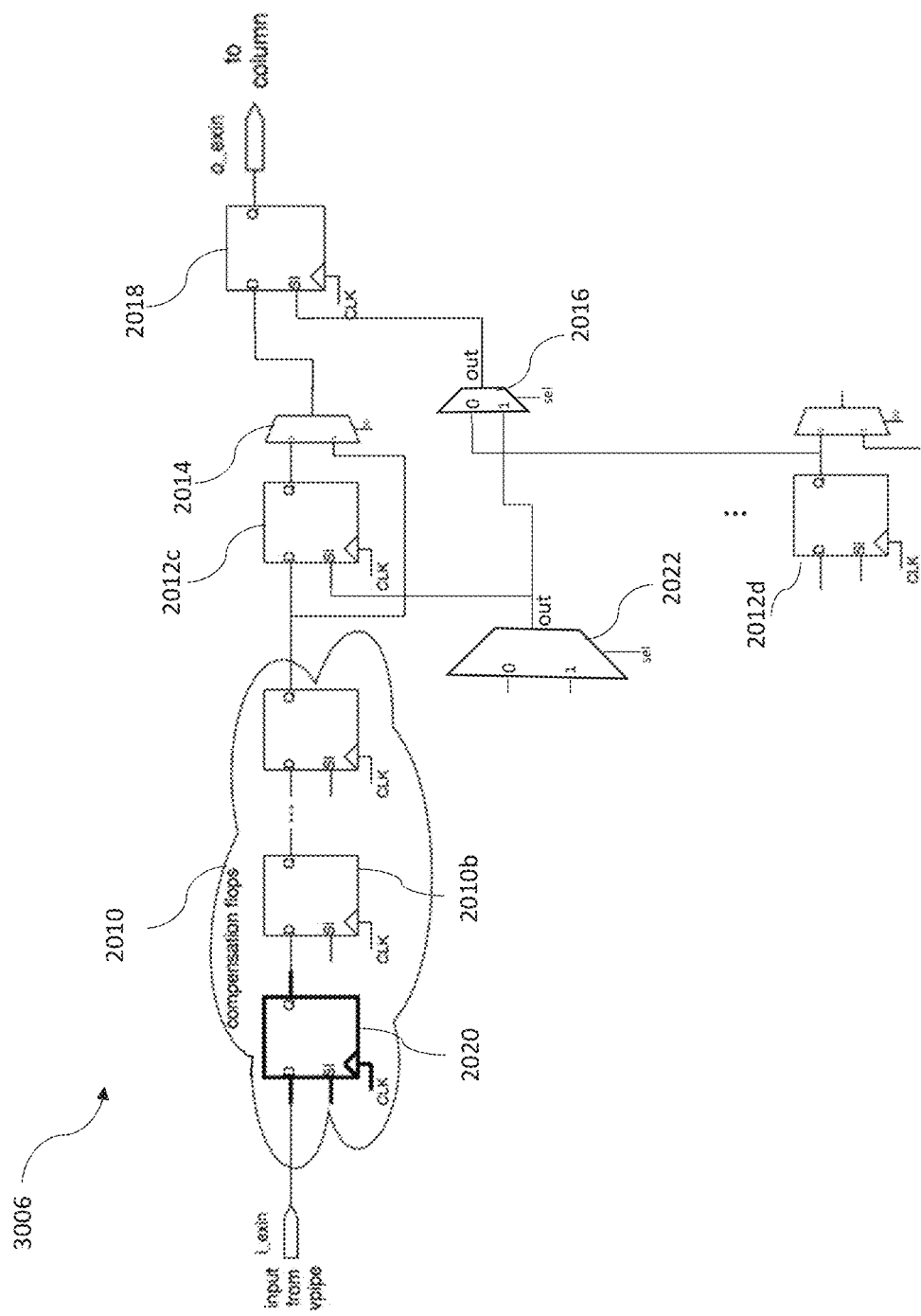
FIG. 10 is a schematic diagram of column pipe circuitry for passing data to tiles and bypassing the circuitry in case of repair.

FIGS. 9 and 10 show examples of how the shuffle logic 3000a, 3000b can be implemented in the column pipe circuitry. The shuffle logic 3000a, 3000b comprises a set of repair bypass multiplexers 2012. There is one bypass multiplexer associated with each supertile for each set of column pipe circuitry 3006. 3008. 3010.

The bypass multiplexers 2016 are used to bypass repair circuitry 2012, 2014 in the column pipe circuitry 3006, 3008, 3010 when a repair has taken place such that the repair circuitry 2012, 2014 is bypassed for the repaired out supertile.

FIGS. 9 and 10 also show an example of how the column pipe circuitry may be altered in order to introduce wrapper chains which are used to separate the column pipes 3004 and the exchange from the columns 62. These wrapper chains allow the exchange circuitry to be tested without loading the columns 62, allowing for a quicker and simpler scan test to be performed.

FIG. 9 shows the column pipe circuitry for data which passes from the tiles 4, i.e. the output column circuitry 3008 and select column circuitry 3010 as shown in FIG. 8. It will be appreciated that although both exout and exmux signals are shown as being passed through the circuitry of FIG. 9, there is a different but identical set of circuitry for each of the signals.

The column pipe circuitry comprises a set of compensation flops 2010, the repair multiplexer 2014, and the repair bypass multiplexer 2016. There is a set of compensation flops 2010, repair flop 2012, and repair multiplexer 2014 for each exchange line to which the supertiles 61 of the column 62 is connected, i.e. for each column of the column pipe circuitry as discussed with reference to FIG. 8.

FIG. 9 shows a single column of the output and select column circuitry 3008, 3010. The column is shown in FIG. 9 rotated 90°. FIG. 9 shows the final column of these sets of circuitry, that is the column into which the scan data is first passed. Each additional column of the output and select column pipe circuitry 3008, 3010 also comprises bypass circuitry 2012, 2014 and compensation flops 2010.

Only one repair bypass multiplexer 2016 is provided for each supertile 61 in each set of the column circuitry 3008, 3010. This is connected to the circuitry of the column into which the scan data is passed from the supertile, i.e. the final column in FIG. 8. The repair bypass multiplexer 2016 is therefore shown in FIG. 9 but is not connected to any of the other columns of flops in the column circuitry 3008, 3010.

The repair flop 2012 and repair multiplexer 2014 are positioned before the compensation flops 2010 in each column. That is, scan data passes from the supertile 61 through the repair flop and multiplexer 2012, 2014 before passing to the compensation flops 2010.

The set of compensation flops 2010 are used to provide column-based compensation delays, which allow identical exchange code to be used for similar intra-column exchanges and some similar inter-column exchange pattern. The repair multiplexer 2014 provides signals to multiplexers associated with each compensation flop 2010 to control the compensation delay. This is discussed in more detail below.

The repair bypass multiplexer 2016 is used to bypass all of the repair flops 2012 in the column circuitry associated with repaired out supertile. Only a single repair bypass multiplexer 2016 is needed in order to bypass all of the repair flops of the output or select column circuitry 3008, 3010.

The select signal of the repair bypass multiplexer 2016 is the same as the select signal for the repair multiplexer 2014. The repair bypass multiplexer 2016 is a 2-to-1 multiplexer. The high (1) input of the repair bypass multiplexer 2016 is connected to the scan input of the repair flop 2012a of the final column pipe column. The low (0) input of the repair multiplexer 2016 is connected to the output of a repair flop 2012b of the first column pipe column (shown at the bottom of FIG. 9).

The scan input of the repair flop 2012a of the final column receives the scan data from the associated supertile 61. The output of each repair flop 2012 of each column is connected to the scan input of the repair flop 2012 on the subsequent column pipe row. The output of each repair flop 2012 is also connected to the low (0) input of the repair multiplexer 2014 in the same column. The compensation flops 2010 for each column are connected in a similar way. The output of the repair bypass flop 2012b and each compensation flop 2010 in the first column is connected to the input of the next flop in the final column to form the scan chain.

The final compensation flop 2010 in each row is not connected to the scan chain. These flops are referred to as wrapper flops 2020 and are used to form a wrapper chain. Wrapper chains are known in the art and are used to isolate circuitry for testing. In the chip 2 disclosed herein, the wrapper chains provide a method for isolating the circuitry for each column 62. This allows each column 62 to be tested separately. The wrapper chain itself is a scan chain, but is separate to the scan chain described above.

During scan testing, if no repair has taken place, the select signal for the repair and repair bypass multiplexers 2014, 2016 is set to low (0), such that the output of each repair multiplexer 2014 is the output of its associated repair flop 2012, and the output of the repair bypass multiplexer 2016 is the output of the repair flop 2012b of the first column pipe column. The output of the repair bypass multiplexer 2016 is connected to the scan input of a first compensation flop 2010a of the final column. The repair bypass multiplexer 2016 in this scenario has no effect on the scan chain.

However, if a repair has taken place in the column 62, the select signal is set to high (1). The high (1) inputs of the repair multiplexers 2014 are connected to the data inputs of their associated repair flops 2012. Therefore, there is no output from the repair multiplexers 2014 during scan testing. Since the high (1) input for the repair bypass multiplexer 2016 is connected to the scan input of the repair flop 2012a of the first column pipe row, the output of the repair bypass multiplexer 2016 is the scan data. The scan data, therefore, never pass through the repair flops 2012 or repair multiplexers 2014 when a repair has occurred, and so removes these logic elements from the scan chain.

FIG. 10 shows a single column of the column pipe circuitry for data passing from the switching fabric to the tiles 4, i.e. the input column circuitry 3006. Similarly to the circuitry shown in FIG. 9, this circuitry comprises a set of compensation flops 2010, a repair multiplexer 2014, and a repair bypass multiplexer 2016 for each column of the input column circuitry 3006, here shown rotated through 90°. Each column of the column pipe circuitry 3006 also comprises an extra pipeline stage flop 2018.

A scan multiplexer 2022 and the repair bypass flop 2016 form part of the shuffle logic. There is one scan multiplexer 2022 and one repair bypass flop 2016 for each set of input column circuitry for each supertile 61 of the column 62.

Conversely to the circuitry for data traveling from the column 62, the repair flop 2012 and the repair multiplexer 2014 are positioned after the compensation flops 2010. That is, the scan data pass through the compensation flops 2010 before passing to the repair flop and multiplexer 2012, 2014. The extra pipeline stage flop 2018 is positioned after the repair multiplexer 2014 such that it is the final piece of logic through with the scan data pass before passing to the tiles 4.

The low (0) input of the repair bypass multiplexer 2016 is connected to the output of the repair flop 2012d of the last column of the input column pipe circuitry 3006. The high (1) input of the repair bypass multiplexer 2016 is connected to the output of the scan multiplexer 2022. The select line of the repair bypass multiplexer 2016 receives the same input as the repair multiplexers 2014.

The scan multiplexer 2022 provides the scan data during scan testing from the shuffle logic 3000b. The output of the scan multiplexer 2022 is connected to both the scan input of the repair flop 2012c of the first column of the input column pipe circuitry 3006 and the repair bypass multiplexer 2016 as discussed above. The output of each of the repair flops 2012 is connected to the low (0) input of the repair multiplexer 2014 in the same column.

If no repair has been performed, the select signal to the repair multiplexers 2014 and the repair bypass multiplexer 2016 is low. This results in the scan input for the extra pipeline stage flop 2018 of the first column of the column pipe circuitry being the output of the repair flop 2012d of the final column of the column pipe circuitry. That is, the scan data is passed through the scan chain as if the repair bypass multiplexer 2016 were not present, testing all of the repair flops 2012.

However, if a repair has taken place, the select signal to the repair multiplexers 2014 and the repair bypass multiplexer 2016 is high. Since the high input of the repair bypass multiplexer 2016 is connected to the output of the scan multiplexer 2022, and the output of the repair bypass multiplexer 2016 to the scan input of the extra pipeline stage flop 2018 of the first column, the scan chain bypasses the repair flops 2012 and repair multiplexers 2014, as well as the compensation flops 2010.

The shuffle logic 3000a, 3000b of the column pipe 3004 is therefore used to replace whole scan chains associated with the repaired out supertile.

The first compensation flop of each column of the input column pipe circuitry 3006 is used to form a wrapper chain. The first compensation flops may also be referred to herein as wrapper flops 2020 as they are used to form the wrapped chain.

The wrapper chain is separate from the scan chain described above. The wrapper chain is also a scan chain, but comprises only the wrapper flops 2020.

There are wrapper flops 2020 associated with each column of the column circuitry 3006, 3008, 3010 of each supertile 61 of the column 62, such that there is a wrapper chain at each edge of the circuitry associated with the column 62.

The effect of the two wrapper chains described above, one on the circuitry for passing data to the tiles 4 of the column 62 and one on the circuitry for passing data from the tiles 4 of the column 62, is that the circuitry associated with the column 62 is isolated from the circuitry of the other columns. This is desirable as it allows for scenarios in which different supertiles in different columns 62 are replaced, or when repair has been implemented in some columns 62 but not others. Additionally, the exchange can be tested without loading the entire column 62 or supertile. That is, the scan chains test the exchange circuitry only and the scan bits do not need to pass through each tile 4 of the column 62. This allows for quicker testing and easier avoidance of the faulty tile 4.

Figure 15:
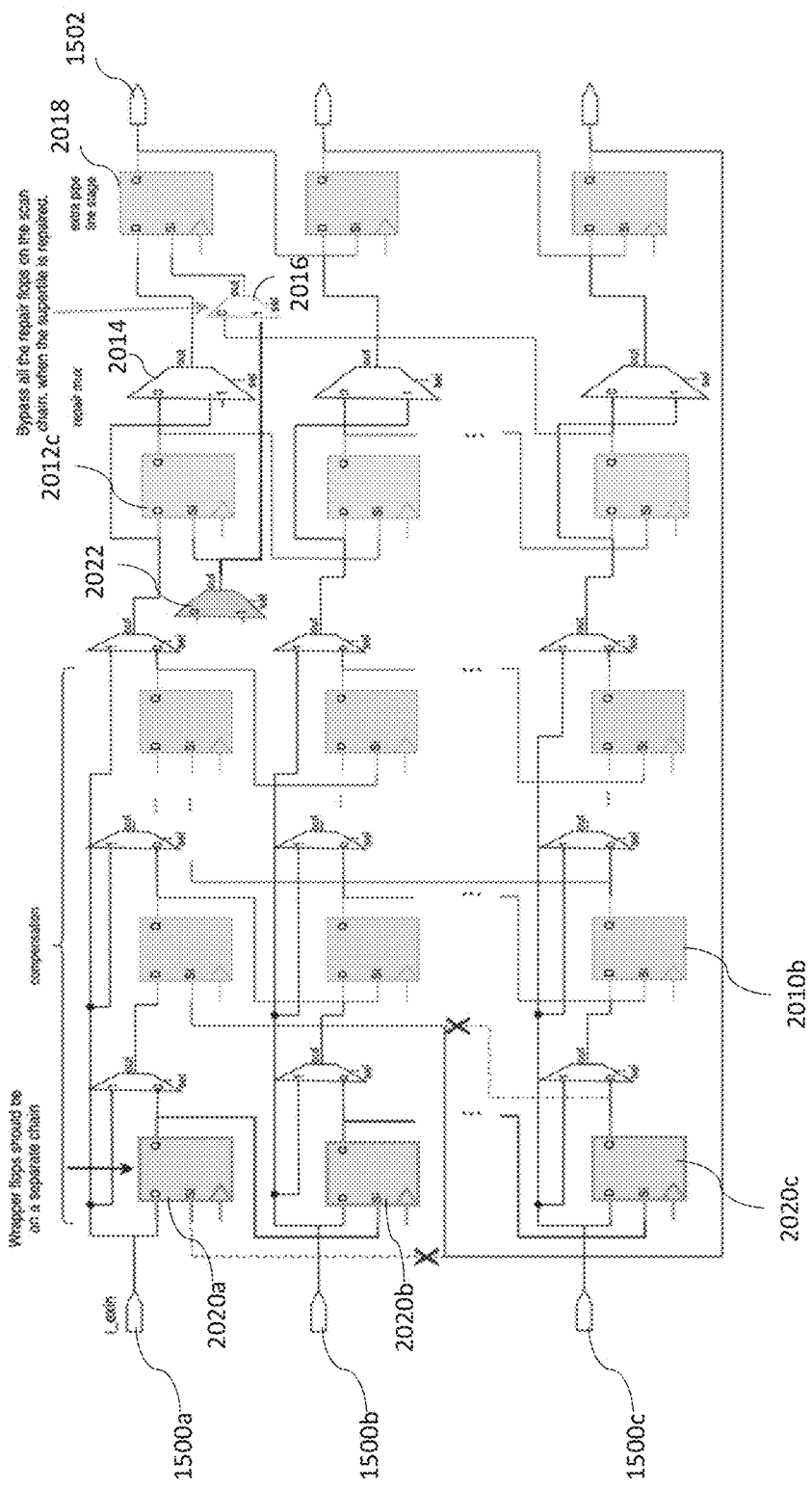
FIG. 15 is a schematic diagram of column pipe circuitry for passing data from the switching fabric to the tiles.
Figure 16:
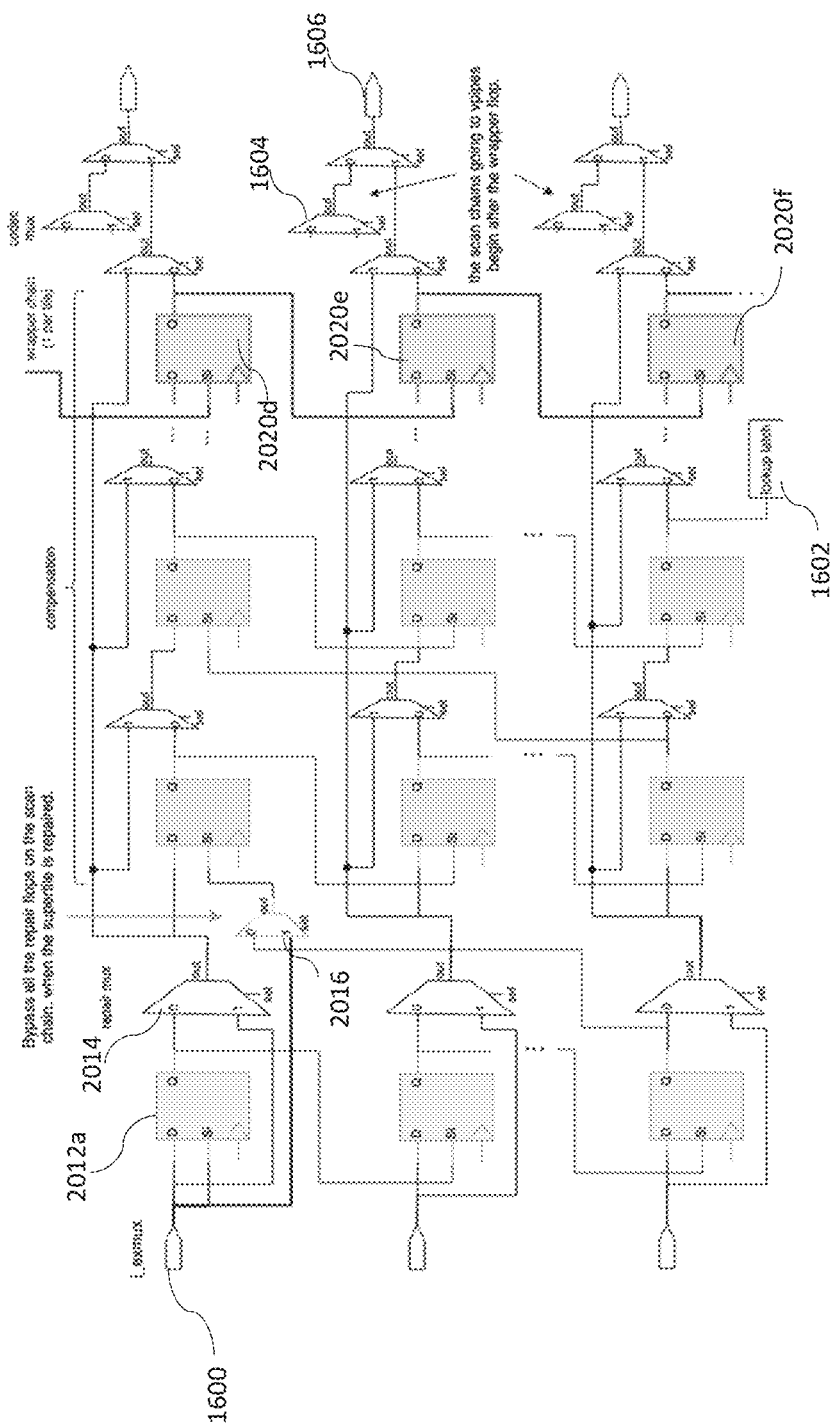
FIG. 16 is a schematic diagram of column pipe circuitry for passing data from the tiles to the switching fabric.

The column pipe wrapper chains described above with reference to FIGS. 9 and 10 are shown in more detail in FIGS. 16 and 15 respectively.

FIG. 15 shows a set of columns of the column pipe circuitry for passing data from the switching fabric to the tiles 4, i.e. the input column circuitry 3006. During functional operation, i.e. during computation, signals are received from the exchange at column pipe inputs 1500*a*, 1500*b*, 1500*c*, and passed to the data inputs of the compensation flops as required to compensate for any repairs, and output to the tiles 4 via the column pipe outputs 1502 corresponding to the tiles in functional operation.

However, during an exchange scan test, the scan data is received at the wrapper flops 2020*a*, 2020*b*, 2020*c* from the respective column pipe inputs 1500*a*, 1500*b*, 1500*c*, but the wrapper flops 2020*a*, 2020*b*, 2020*c* prevent the scan data from progressing any further through the input column pipe circuitry 3006, such that the scan data for testing the exchange is not passed to the tiles 4 of the column 62. This is achieved by not connecting the outputs of the wrapper flops 2020*a*, 2020*b*, 2020*c* to the scan inputs of any of the first compensation flops 2010*b* of the columns of the input column pipe circuitry 3006. Therefore, the column 62 is isolated from the exchange during an exchange scan test.

During a column scan test, the scan test data is received at the input column pipe circuitry 3006 via the scan multiplexer 2022. The scan data is received at both the scan input of the repair flop 2012*c* of the first column and the high (1) input of the bypass multiplexer 2016.

As set out above, the select signal provided to the bypass multiplexer 2016 is high if there has been a repair, such that the scan data passes directly from the scan multiplexer 2022 to the extra pipeline stage flop 2018 of the first column. If instead there has been no repair, the select signal provided to the bypass multiplexer 2016 is low, such that the scan data passed to the extra pipeline stage flip 2018 of the first column has been received at the bypass multiplexer 2016 from the repair flop of the final column. In this instance, the scan data has passed from through each of the repair flops 2012 in turn, before passing to the bypass multiplexer 2016.

The output of the extra pipeline stage flop 2018 of the first column is connected both to a column pipe output 1502 and the scan input of the extra pipeline stage flop of the second column. Each extra pipeline stage flop output is similarly connected, except that output of the extra pipeline stage flop of the final column, which is connected to its respective column pipe output and the scan input of the first compensation flop 2010*b* of the first column. The scan chain is stitched through each compensation flop 2010 of the input column pipe circuitry 3006, but does not pass through the wrapper flops 2020*a*, 2020*b*, 2020*c*.

The scan data also passes to the tiles 4 of the column 62 via the column pipe outputs 1502 in order to test the column circuitry.

FIG. 16 shows a set of columns of the column pipe circuitry for data passing from the tiles 4 to the switching fabric, i.e. the output column circuitry 3008. During functional operation, i.e. during computation, signals are received from the tiles a at column pipe inputs 1600 and passed to the data inputs of the compensation flops as required to compensate for any repairs, and output to the exchange lines via the column pipe outputs 1606 corresponding to the tiles in functional operation.

However, during an exchange scan test, the scan data is received from the codex at the codex multiplexer 1604, located after the wrapper flops 2020*d-f*, such that the exchange scan data does not pass through any flops of the output column circuitry. The exchange scan data is passed to the respective exchange lines via the column pipe outputs 1606.

During a column scan test, the scan test data is received at the output column pipe circuitry 3008 via the column pipe inputs 1600. The scan data is received at both the scan input of the repair flop 2012*a* of the first column and the high (1) input of the bypass multiplexer 2016.

As set out above, the select signal provided to the bypass multiplexer 2016 is high if there has been a repair, such that the scan data passes directly from the column pipe input 1600 to the first compensation flop of the first column. If instead there has been no repair, the select signal provided to the bypass multiplexer 2016 is low, such that the scan data passed to the compensation flop of the first column has been received at the bypass multiplexer 2014 from the repair flop of the final column. In this instance, the scan data has passed from through each of the repair flops 2012 in turn, before passing to the bypass multiplexer 2016.

The output of each compensation flop is connected to both the scan input of the compensation flop in the next column and a compensation multiplexer, the output of which is connected to the data input of the next flop in the column. In normal operation, data signals pass from the last compensation multiplexer in each column to the wrapper flop 2020*d-f* and to the exchange via the column pipe output 1606. The output of the compensation lop in the last column is connect to the scan input of the next compensation flop in the first column.

The signal inputs of the wrapper flops 2020*d-f* are not connected to the compensation flops. The wrapper flops 2020*d-f* are instead only stitched to each other to form a wrapper chain. That is, the scan input of each wrapper flop 2020*d-f* is connected to the output of the wrapper flop 2020*d-f* of the previous column, with scan input of the wrapper flop 2020*d* of the first column being connected to the output of the final wrapper flop of an adjacent column. This prevents the column scan data from passing to the exchange.

Figure 14:
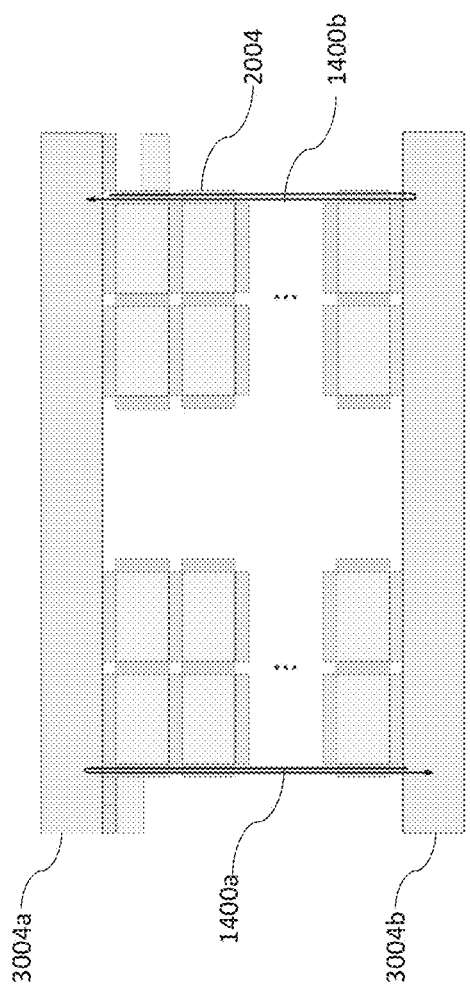
FIG. 14 is a schematic diagram showing wrapper chains in the exchange fabric.

In order to improve efficiency of the exchange scan test, the exchange fabric can be segmented using exchange wrapper chains 1400*a*, 1400*b*, as shown in FIG. 14. The exchange wrapper chains 1400*a*, 1400*b* are located at the edge of the section of the exchange corresponding to each slice. The exchange section for each slice is, thus isolated from the other sections of the exchange such that each slice can be tested separately.

The exchange wrapper chains 1400*a*, 1400*b* are located in the hpipes of the exchange. The flops of the hpipes are stitched similarly to those in the column circuitry, such that the flops of the exchange wrapper chain are connected only to scan inputs of other flops of the exchange wrapper chain, and so preventing scan data from passing between slices of the exchange.

Figure 12:
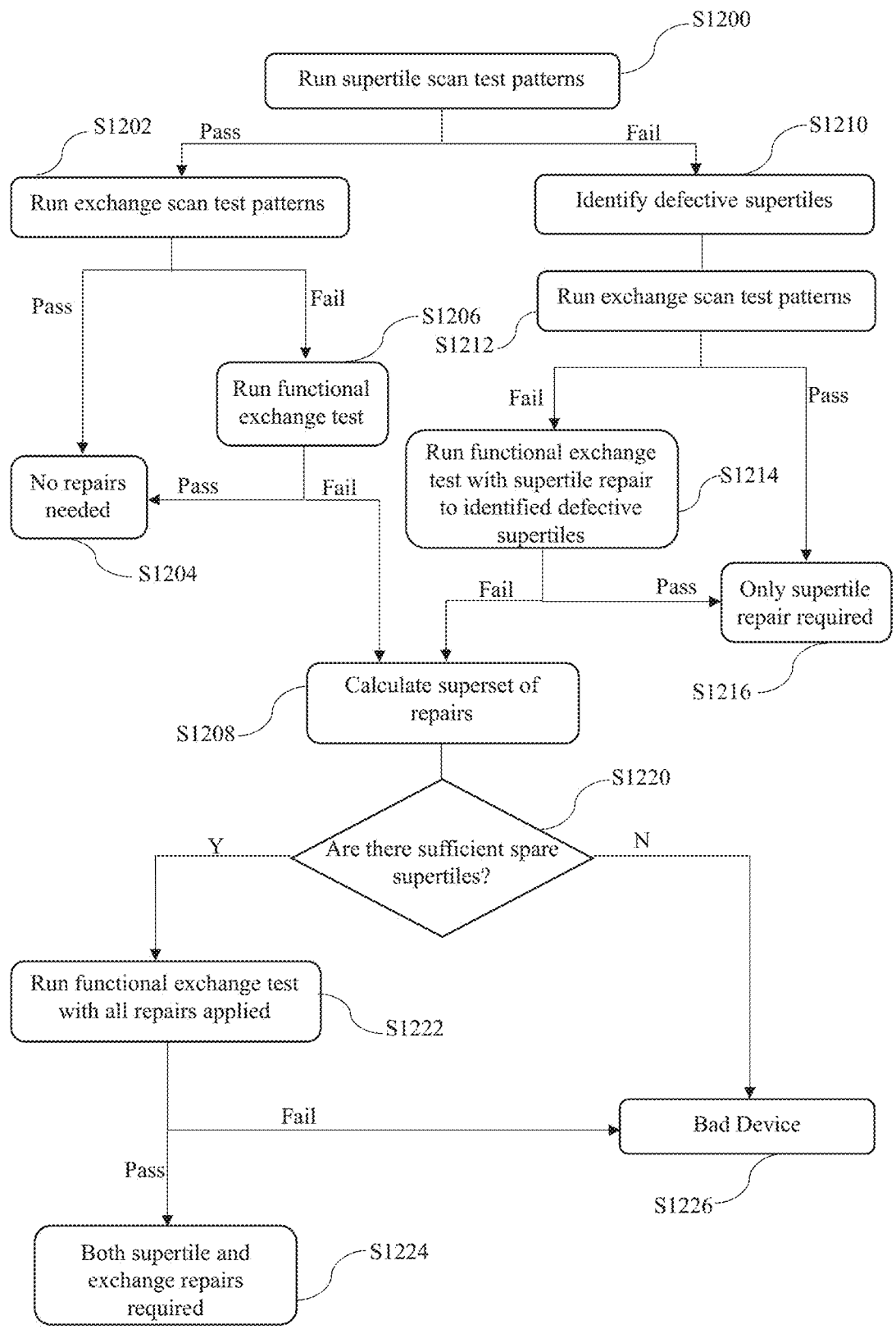
FIG. 12 is a flow diagram of an example method for determining how a processor is to be repaired.

FIG. 12 shows an example method for determining how the processor 2 is to be repaired.

At step S1200, a scan test is performed to test the supertiles for defects. The patterns associated with the supertile scan test are run through the supertile scan chain and the output analysed in order to identify any faulty supertiles. This information is needed in the event that a functional exchange test needs to be run as in the following.

If the processor passes the supertile scan test, the processor does not contain any faulty supertiles.

The exchange scan test is performed by running a first set of exchange test patterns, step S1202, though the exchange.

If the processor also passes the exchange scan test, the exchange does not comprise any faults, and no repairs are required, step S1204.

If, however, the exchange does not pass the exchange scan test, a functional exchange test is run at step S1206. The functional test is run for the segments of the exchange connected to the supertiles of each column which are currently set to be functionally operational. This excludes any supertiles which were found to be faulty in the supertile scan test at step S1200. In some embodiments, only the first 19 supertiles of each column are involved in the functional test (leaving out certain supertiles which are available for repair).

If these exchange segments pass the functional test, the segments of the exchange connected to the supertiles which are to be used in operation are not faulty and therefore no repair is required, step S1204.

If, however, the exchange does not pass the functional exchange test, at least one repair is required for the processor 2 to function. The faulty exchange segments are identified from the functional test and the supertiles connected to these faulty exchange segments identified. A superset of repairs is then calculated at step S1208, the superset identifying all supertiles which need to be repaired out, due to either a fault in the supertile or a fault in the connected exchange segment.

Returning to step S1200, if the processor fails the supertile scan test, the defective supertiles are identified at step S1202.

As above, the exchange scan test is then run, step S1212. If the exchange passes the exchange scan test, there are no faults in the exchange and therefore the processor only needs to be repaired to accommodate for the faults in the identified faulty supertiles, step S1216.

If, however, the exchange fails the exchange scan test, there is at least one fault in the exchange. The functional exchange test is run in order to identify which of the exchange segments is faulty at step S1214. In this case, the functional test is run with supertile repair applied to the identified faulty supertiles. That is, any supertiles which were found to be faulty in the supertile scan test at step S1200 are excluded, and the positions of the exchange to which these supertiles are connected are excluded from the functional test.

By way of example, if it is identified at step S1210 that supertile 5 of column 2 is faulty, the functional exchange test is run while bypassing the exchange segment connected to supertile tile 5 of column 2, but including the exchange segment connected to supertile 20 of column 2. This allows the exchange segments which are connected to the supertiles which will be in functional operation to be tested.

If the exchange segments connected to the supertiles to be used after supertile repair pass the functional test, only the repairs required for supertile tile repair are needed, step S1216.

However, is the exchange fails the functional test, repairs are also required in order to accommodate for faults in the exchange. The superset of repairs is calculated at step S1208, by identifying the faulty exchange segments and thus the supertiles connected to the faulty exchange segments. The superset of repairs, as above, identifies all of the supertiles which need to be repaired out to accommodate for faults in both the supertiles themselves and the exchange.

Once the superset of repairs has been calculated, it is determined at step S1220 if there are sufficient spare supertiles for the repairs. For example, if a column has 20 supertiles with 1 spare supertile, only 1 supertile of the column can be repaired out for the column to still be functional.

By way of example, if column 7 contains a faulty supertile at supertile 12 and supertile 17 of column 7 is connected to a faulty exchange segment, two supertiles (supertile 12 and supertile 17) would need to be repaired out in order to accommodate for the faults. This is not possible with only one spare supertile in the column. However, if only supertile 12 or the exchange segment connected to supertile 17 was faulty, only one supertile would need to be repaired out and therefore the repair would be possible. With a single spare supertile, a repair would be possible if the faulty exchange segment were connected to a faulty supertile. In all other scenarios, there can be only one faulty component per column in the case of one spare supertile. This is because a repair conflict cannot be resolved.

In the event that there are insufficient spare supertiles in a column to accommodate for all of the repairs required for that column, the device is bad, step S1226, as it cannot be repaired.

If, however, there are sufficient supertiles to accommodate for the superset of repairs, the functional exchange test is again run, this time with the superset of repairs applied, step S1222.

If the functional test is passed, the superset of repairs is used to repair the processor since both the supertile and exchange repairs are required, step S1224. That is, all of the functional failures have been identified and the superset of repairs fixes the failures.

If, however, the processor fails this test, the device is bad, step S1226.

However, if the columns comprise multiple spare supertiles, and the functional exchange test fails at step S1222, the method returns to step S1208, where a new superset of repairs in calculated. This is because the functional test only tests those segments of the exchange which are connected to functionally operational supertiles, rather than all of the supertiles.

The method then continues again to step S1220 and so forth. The step of calculating the superset of repairs may be implemented as many times as there are spare tiles in the columns.

The set of repairs required as found in step S1216 may also be referred to herein as a superset of repairs as it defines all of the repairs required to accommodate for the functional faults of the processor.

Figure 13:
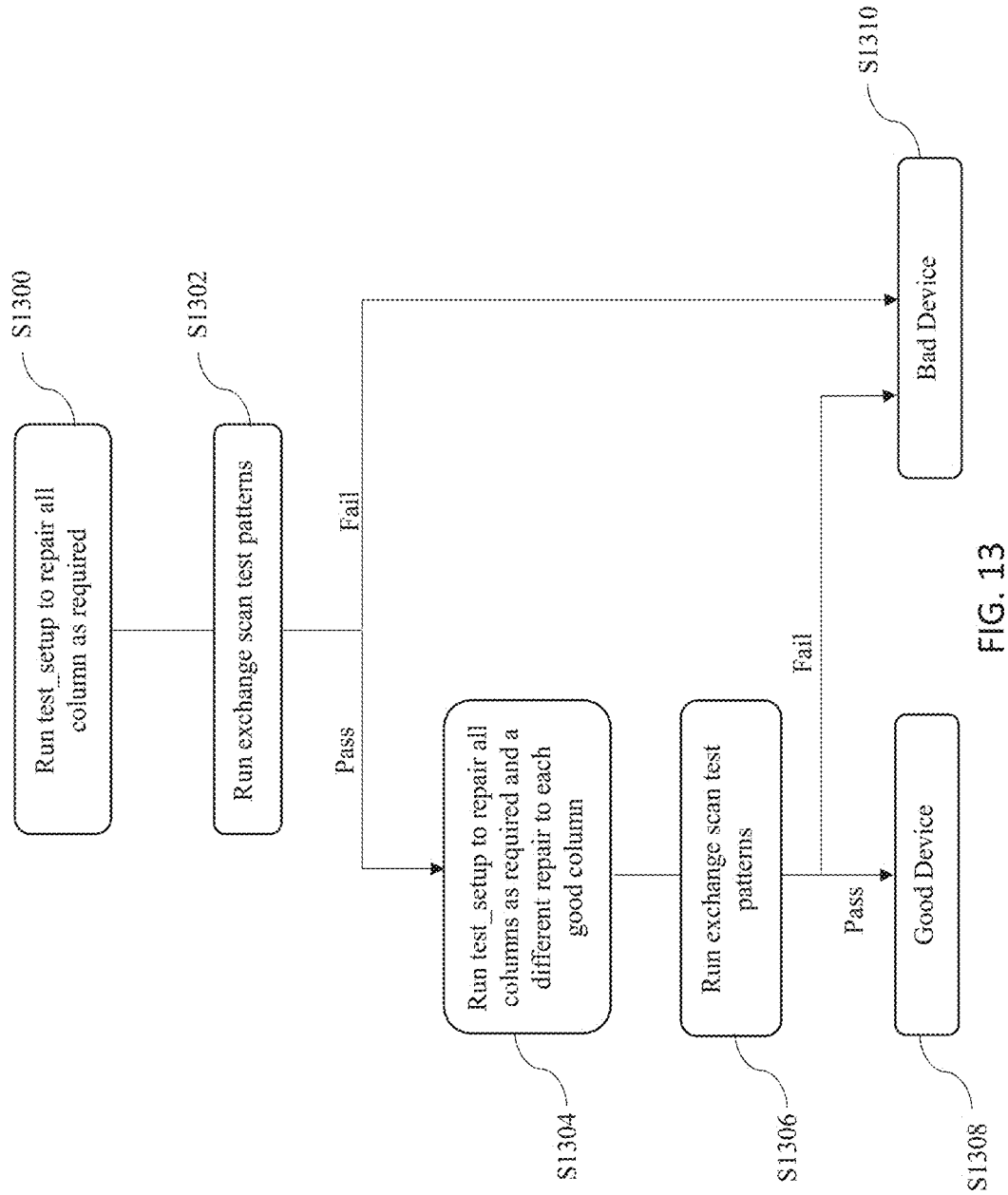
FIG. 13 is a flow diagram showing an example method for checking a device after repair.

Once the functional repairs have been identified, S1216 or S1224, as automatic test pattern generator pattern is used to sign off on the repair. FIG. 13 shows an example method of this process.

At step S1300, test setup is run to repair the processor as defined by the superset of repairs. A second set of exchange scan test patterns is run at step S1302.

If the processor fails this test, the device is bad, S1310.

However, if the device passes the test, test setup is run with all repairs as defined in the superset of repairs and a repair for any column for which no repair is defined in the superset, step S1304. For example, any column which is not identified in the superset as requiring a repair (a "good" column) is repaired such that the spare supertile is used and one of the other functional supertiles is removed from operation. This provides a way in which the ability for in-field repairs can be assessed.

The exchange scan test patterns are again run, step S1306.

If the test fails, the device is bad, S1310. However, if the test passes, the device is good, S1308.

In the methods of FIGS. 12 and 13, two different exchange test sets are used. Each test set comprises at least one vertical and one horizontal test. Vertical tests can be run per slice if runtimes are long, in that case a test set consists of eight separate vertical tests and a single horizontal test with supertiles 'black boxed' (using wrapper chains).

The first test set, as used in the method of FIG. 12, is as follows:
8 slices (vertical mode)+horizontal mode with ALL repair_id>=20
in the event of there being 16 columns and 20 supertiles per column. In this test, there is no repair.

The second test set, as used in FIG. 13, is as follows:
8 slices (vertical mode)+horizontal mode with ALL repair_id<20
in the event of there being 16 columns, 20 supertiles per column, and 1 spare supertile per column. In this test, a single tile is repaired in each column.

In the above test sets, the "vertical test" is used in the context of a slice of the exchange, and "horizontal test" is all of the column multiplexers but with the supertile columns 'black-boxed' and using the wrapper chains at the edge of the column pipes.

Figure 6:
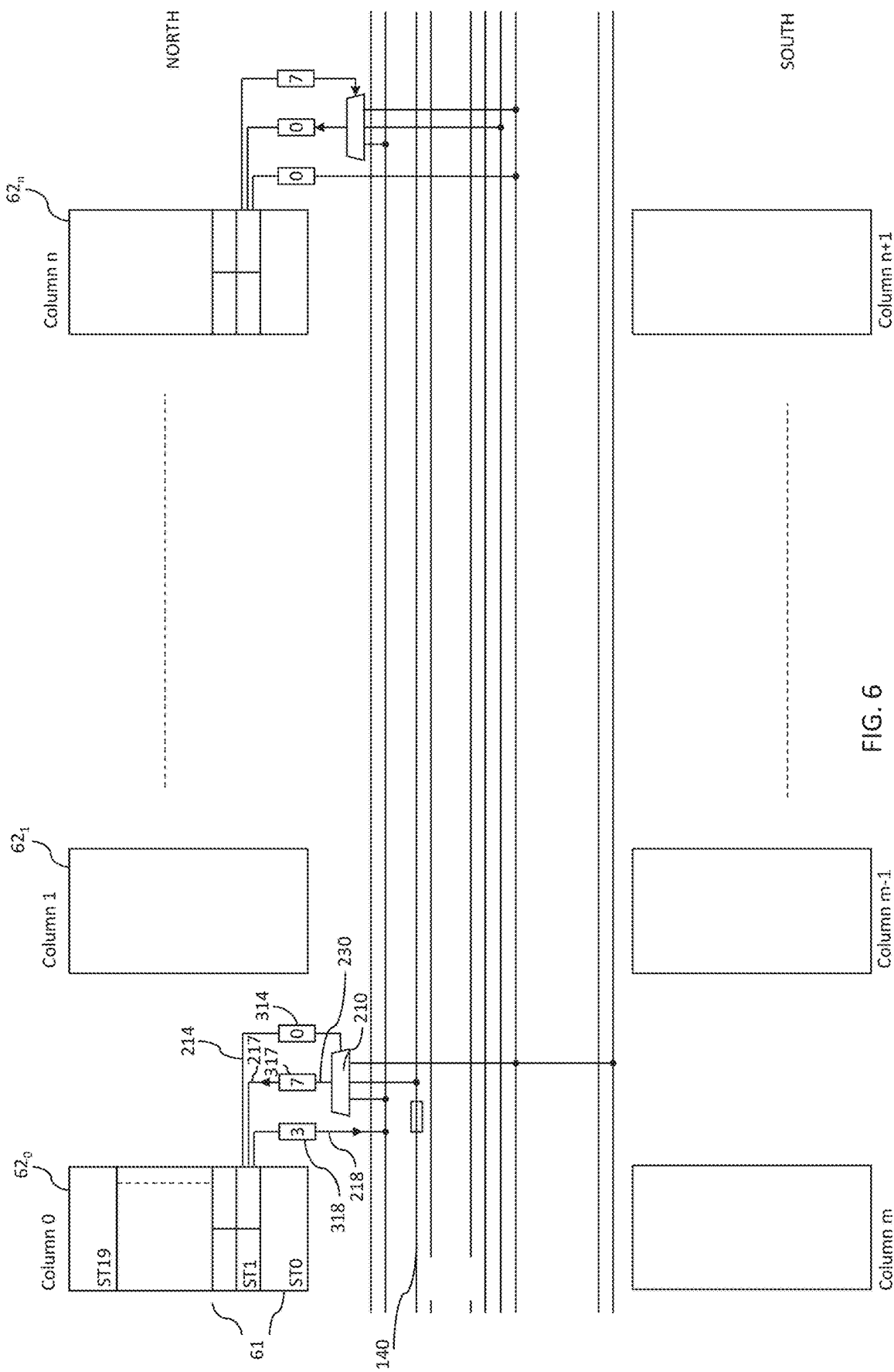
FIG. 6 is a schematic diagram of the architecture.

Column-based compensation delay may be introduced to allow identical exchange code to be used for similar intra-column exchanges and some similar inter-column exchange patterns, as illustrated in FIG. 6. Exchange code comprises the sequence of instructions which are involved in the exchange phase and which manage the exchange of data between tiles.

Exchange code comprises at least a SEND instruction and a switch control instruction. In addition, the exchange code may comprise a memory pointer instruction which can determine the address at which incoming data is loaded. Column-based compensation delay can be introduced by selecting a number of delay stages to form a delay circuit introduced into each of the relevant path components of an exchange pathway between tiles. An exchange pathway comprises the following components.

There is a tile to column-base delay which is the time taken for a datum to propagate from a processing unit in the column to the base of the column. This delay depends on the position of the tile within the column (and is longer for the tiles which are further away from the base of the column). The tile to column-based delay is fixed by the position of the tile within the column and is therefore the same for all respectively positioned tiles in each column.

The column-compensation delay allows for compensation to be introduced in the output path 218 which conveys the output from the tile to the exchange. This is denoted by block 318 in each of the illustrated output lines. It will be appreciated that in theory, the delay circuit could be located anywhere in the output path 218, but in practice the column-based compensation delay for the output line can readily be implemented as a set of delay stages in the space between the column base and the switching fabric on the chip, i.e. in the column pipe 3004. FIG. 6 is highly schematic to illustrate the underlying concepts.

The column-base to exchange bus delay is the time taken for the datum to traverse the distance between the column-base (from the column-based compensation delay stage) to the group of exchange bus wires associated with that column.

There is a delay along the exchange fabric while the datum propagates to be picked up at the correct time by the recipient tile (which may be in the same column or another column). Note that there may be exchange fabric delays horizontally even when a tile sends a message to itself.

A further column-base compensation delay may then be introduced on the input side for the recipient tile. This is illustrated in FIG. 6 as delay circuit 317 in the output of the multiplexor 210.

Any compensation delay which is introduced into the input path also affects the exchange multiplexer 210 control lop delay. To ensure that this is unaffected, this needs to be compensated for by corresponding delay compensation in the multiplexer control line 214, as shown by delay circuit 314.

The shuffle logic will be better understood in the context of the following description of the repair mechanism. As mentioned, each column $62_0$, $62_1$ ... $62_m$ of the processing chip 2 comprises a number of tiles 4 arranged in supertiles 61. According to embodiments of the application, each column 62 comprises a redundant supertile 61 (labelled ST19 in FIG. 6) located at the remotest end of the column from the exchange that may be inactive in any columns 62 that have no faulty tiles 4. In some other embodiments, where a column 62 has no faulty tiles 4, the supertiles 61 may be retained with respective tile identities and used to create a functioning chip with a larger number of tiles. In practice, this would only be feasible in situations where the die required no repair such that all 1280 tiles could be exposed for use. In response to the detection of a fault in a supertile in a column, the redundant supertile ST19 is utilised to render the column functional (76 tiles, 19 supertiles). To achieve this, each supertile "above" the faulty tile acquires the tile identity of its lower adjacent tile and is loaded with the pre-compiled instructions to be executed by the tile having that tile identity.

Figure 4:
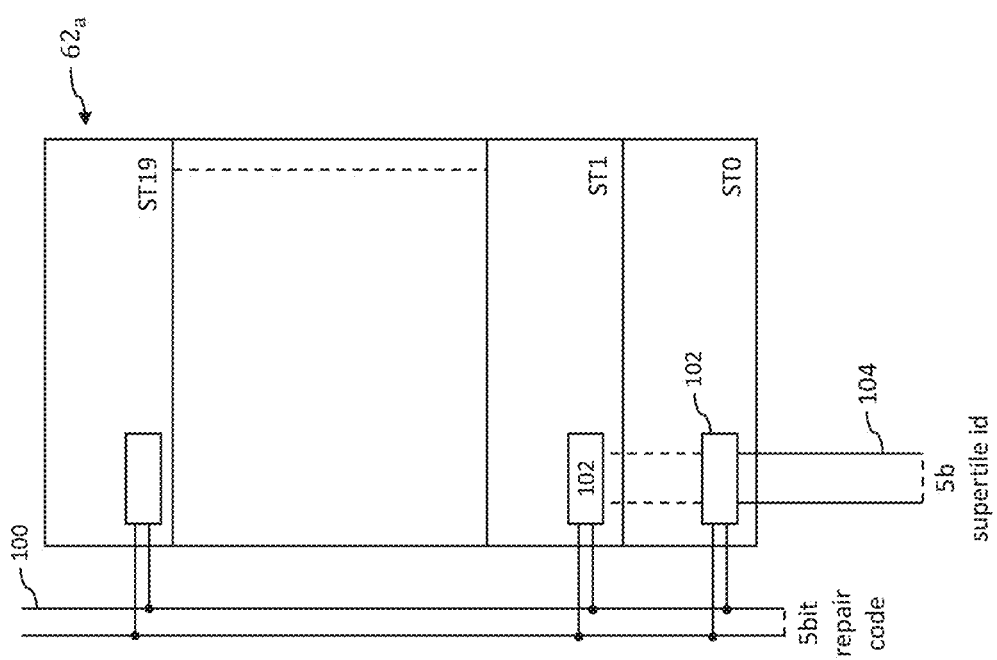
FIG. 4 is a schematic diagram of one column illustrating tile numbering.

FIG. 4 shows a single column 62a of tiles. Each supertile receives a five bit repair code over a code repair bus 100. The repair code is set up after testing the chip and, in this embodiment, enables one supertile per column to be repaired. The repair code may be stored by efuses on the chip in sixteen sets of efuses, one per column. These efuses may be in the repair engine 69. Although only two lines are shown in FIG. 4, this represents five wires, a physical wire for each bit of the repair code. While the repair code bus 100 is shown adjacent the column, it can be implemented in any physical manifestation such that the five bits are each received by a respective supertile in the column. Each column of the array has its own repair code bus. A circuit 102 inspects the five bit repair code and causes an incremented or non-incremented supertile identifier to be propagated. That is, depending on the repair code, the supertile identifier which is propagated to the next supertile is incremented or not.

Figure 3:
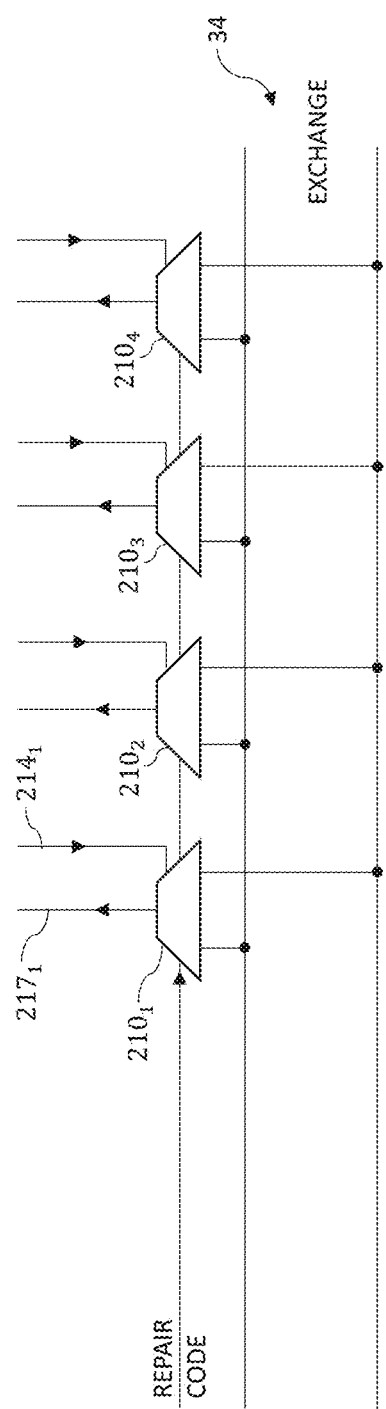
FIG. 3 is a schematic diagram illustrating multiplexer repair.

In FIG. 5, reference numeral 67 denotes a set of multiplexers. Each supertile has four multiplexers 210 connected to the respective inputs of each tile 4 in the supertile 61. The multiplexers for a single supertile are shown in FIG. 3. Each multiplexer has its own multiplexer control line 214, (1, 2, 3, 4)—its output line 217, (1, 2, 3, 4) (which forms the input connection to the tile), and the multiplexer input lines themselves—one input connected to each of the cross wires in a bundle of exchange cross wires 34a in the exchange 34. In FIG. 3, only the first and last input connections to the multiplexer are shown for reasons of clarity. The multiplexers 210, (1, 2, 3, 4) are arranged in a block 67 which receives a repair code. In FIG. 5, this repair code is shown being supplied by the repair engine 69. Note that in FIG. 5, the line providing the repair code to the multiplexer block 67 is not shown complete for reasons of clarity.

The repair code modifies operation of the decoder in the multiplexer block 67 to take into account repaired tiles in a column. As mentioned above, a multiplexer 210 receives a multiplex control signal on the control line 214 which identifies a unique tile identifier indicating where that multiplexer should 'point'. That is, to which set of cross wires on the exchange 34 should that multiplexer connect in order to 'listen to' the tile from which a transmission is expected at that time. The tile identifier is in the form of a five bit supertile ID, a four bit column ID and a two bit tile ID.

Use of repair logic in the context of the repaired tiles will now be described. FIG. 5 shows a column labelled 62m which is shown on the South side of the exchange fabric 34 but which could be anywhere in the array. As described, the column will have 20 supertiles, but only three are shown for the sake of the present explanation. The tiles which are shown are supertiles numbered ST7, ST8 and ST9. Supertile number ST7 has the tile outputs of the tiles on its Eastern side connected to the exchange fabric on sets of wires labelled ST7. As has already been explained, there will be a corresponding pair of exit wires from the tiles on the Western side of supertile number ST7 which will be connected to different sets of wires in the exchange fabric. These are not shown for reason of clarity. Supertile number ST8 similarly has exit wires from its two tiles on the Eastern side of the column connected to the cross wire of the exchange fabric (not shown). The exit wires shown from the two tiles on the Western side of supertile number 8 are also not shown. In this scenario, consider that supertile number ST7 has been found to be defective, and supertile number ST8 has taken on its identity. This means that when a multiplexer is controlled to receive a data that would have been expected from ST7, this datum will now appear on the exchange fabric cross wires at supertile ST8. The multiplexers need to take this into account in order to point to the correct wires in the exchange fabric. This is achieved using the repair logic in each multiplexer 210. Each repair logic receives a repair code which is associated with a respective column. That repair code control has the effect of the decoder on that multiplexer in the following way. The repair logic receives the repair code and compares it with the supertile identifier of the incoming MUX control signal. If the repair code is less than the supertile identifier, it is not repaired, then there is no effect on the decode logic, and the selected supertile matches that with the MUX control signal. However, if the MUX control signal is the same as or greater than the supertile indicated in the repair code, then the multiplexer selects wires according to the super tile ID in the MUX control signal incremented by one. That is, the 9th tile in the column bus is selected instead of the 8th, the 10th instead of the 9th, all the way up to the 20th being selected instead of the 19th. Recall that in each case the 9th tile is number 8, the 8th tile is number 7 etc. (because the first tile is numbered zero).

While particular embodiments have been described, other applications and variants of the disclosed techniques may become apparent to a person skilled in the art once given the disclosure herein. The scope of the present disclosure is not limited by the described embodiments but only by the accompanying claims.

The invention claimed is:

1. A hardware processor comprising:
a plurality of groups of processing units, a first group of the plurality of groups comprising a first processing unit;
an exchange having a plurality of exchange paths configured to transmit data between the processing units of the groups of processing units;
the first group further comprising pipe circuitry configured to provide a controllable path between the exchange and the first group, the pipe circuitry having a wrapper chain configured to prevent a first scan test signal from passing between the plurality of exchange paths and the first group; and
a plurality of exchange scan chains configured to enable a scan test of the plurality of exchange paths, a first exchange scan chain of the plurality of exchange scan chains comprising a first scan chain segment having an exchange path portion segment connected to the first processing unit of the first group.

2. The hardware processor of claim 1, wherein the first exchange scan chain is an exchange wrapper chain configured to prevent a second scan test signal from passing between the first scan chain segment, associated with the first processing unit of the first group, and further remaining scan chain segments of the exchange.

3. The hardware processor of claim 2, the exchange comprising a plurality of slices, wherein the first group is associated with a first slice of the plurality of slices, the first slice comprising a plurality of exchange path portions connected to the first group.

4. The hardware processor of claim 3, wherein the first slice is associated with the first group and an additional group of processing units.

5. The hardware processor of claim 3, wherein the exchange wrapper chain is arranged to prevent the second scan test signal from passing between the plurality of exchange path portions and remaining exchange path portions of the exchange.

6. The hardware processor of claim 5, wherein the exchange wrapper chain is arranged at an extremity of the first slice.

7. The hardware processor of claim 5, wherein the first slice comprises the exchange wrapper chain and an additional exchange wrapper chain.

8. The hardware processor of claim 1, wherein the wrapper chain comprises a plurality of wrapper flops arranged to prevent the first scan test signal from passing between the pipe circuitry and the first group.

9. The hardware processor of claim 8, wherein each wrapper flop of the plurality of wrapper flops is associated with a respective processing unit of the first group.

10. The hardware processor of claim 8, wherein the pipe circuitry comprises:

a set of input circuitry, through which data passes from the exchange to the first group during computation, and a set of output circuitry, through which data passes from the first group to the exchange during computation, wherein the pipe circuitry includes a plurality of wrapper chains and each of the set of input circuitry and the set of output circuitry comprise a respective wrapper chain of the plurality of wrapper chains.

11. The hardware processor of claim 10, wherein the set of input circuitry comprises a plurality of flops arranged in rows, each row associated with a respective processing unit of the first group, a first wrapper flop being arranged before a first flop of a first row, such that data is first received from the exchange during computation at the first wrapper flop before being received at the first flop of the first row.

12. The hardware processor of claim 10, wherein the set of output circuitry comprise a plurality of flops arranged in rows, each row associated with a respective processing units of the first group, a first wrapper flop arranged after a last flop of a first row, the last flop being a particular flop of the first row at which data is last received before being passed to the first wrapper flop and then to the exchange during computation.

13. The hardware processor of claim 1, wherein each exchange path comprises a set of exchange path portions, and wherein each scan chain segment is associated with a respective exchange path portion.

14. A processor comprising:

a plurality of columns of processing units, a first column comprising a first plurality of processing units an exchange comprising a plurality of exchange paths configured to transmit data between the columns, a first exchange path of the plurality of exchange paths comprising a first set of exchange path portions;

column pipe circuitry, including first column pipe circuitry associated with the first column and configured to provide a controllable path between the exchange and the first plurality of processing units; and a plurality of exchange scan chains configured to enable scan testing of the exchange paths of the exchange, a first exchange scan chain of the plurality of exchange scan chains comprising a first plurality of scan chain segments, each scan segment of the first plurality of scan chain segments comprising an exchange path portion segment connected a respective processing unit of the first plurality of processing units, wherein the first exchange scan chain is an exchange wrapper chain configured to prevent a first scan test signal from passing between the first plurality of scan chain segments and remaining scan chain segments of the exchange.

15. The processor of claim 14, wherein the first column pipe circuitry comprises a column wrapper chain configured to prevent a second scan test signal from passing between the first exchange path and the first plurality of processing units.

16. The processor of claim 14, the exchange comprising a plurality of slices, wherein each column of the processor is associated with a respective slice of the exchange, a first slice of the exchange comprising a portion of each exchange path connected to the first column.

17. The processor of claim 16, wherein the first slice is associated with the first column and a second column.

18. The processor of claim 16, wherein the exchange wrapper chain is arranged to prevent the first scan test signal from passing between portions of the exchange paths of the first slice and remaining portions of the exchange.

19. The processor of claim 14, wherein the wrapper chain comprises a plurality of wrapper flops arranged to prevent the first scan test signal from passing between the first column pipe circuitry and the first plurality of processing units.

20. The processor of claim 19, wherein each wrapper flop of the plurality of wrapper flops is associated with a respective processing unit of the first plurality of processing units.

* * * * *